(12) United States Patent
Lin et al.

(10) Patent No.: US 6,781,528 B1
(45) Date of Patent: Aug. 24, 2004

(54) VECTOR HANDLING CAPABLE PROCESSOR AND RUN LENGTH ENCODING

(75) Inventors: Chien-Hsin Lin, Cupertino, CA (US); Mitchell Oslick, Mountain View, CA (US); Mushtaq Sarwar, Santa Clara, CA (US)

(73) Assignee: Apple Computer, Inc., Cupertino, CA (US)

( * ) Notice: Subject to any disclaimer, the term of this patent is extended or adjusted under 35 U.S.C. 154(b) by 0 days.

(21) Appl. No.: 10/280,148

(22) Filed: Oct. 24, 2002

(51) Int. Cl.[7] .............................................. H03M 7/46
(52) U.S. Cl. ............................ 341/63; 341/65; 708/210
(58) Field of Search ............................ 341/63, 65, 67; 710/210, 211

(56) References Cited

U.S. PATENT DOCUMENTS

| | | |
|---|---|---|
| 3,016,527 A | 1/1962 | Gilbert et al. |
| 3,675,212 A | 7/1972 | Raviv et al. |
| 5,173,695 A | 12/1992 | Sun et al. |
| 5,510,852 A | 4/1996 | Shyu |
| 5,740,283 A | 4/1998 | Meeker |
| 5,754,186 A | 5/1998 | Tam et al. |
| 5,768,445 A | 6/1998 | Troeller et al. |
| 5,798,767 A | 8/1998 | Poole et al. |
| 5,812,791 A | 9/1998 | Wasserman et al. |
| 5,844,854 A | 12/1998 | Lee |
| 5,875,355 A | 2/1999 | Sidwell et al. |
| 5,878,267 A | 3/1999 | Hampapuram et al. |
| 5,943,058 A | 8/1999 | Nagy |
| 5,946,113 A | 8/1999 | Pritchett |
| 5,963,744 A | 10/1999 | Slavenburg et al. |
| 5,974,380 A | 10/1999 | Smyth et al. |
| 5,990,812 A | 11/1999 | Bakhmutsky |
| 6,021,420 A | 2/2000 | Takamuki |
| 6,122,690 A | 9/2000 | Nannetti et al. |
| 6,122,722 A | 9/2000 | Slavenburg |
| 6,145,077 A | 11/2000 | Sidwell et al. |
| 6,195,026 B1 | 2/2001 | Acharya |
| 6,201,530 B1 | 3/2001 | Thadani et al. |
| 6,219,457 B1 | 4/2001 | Potu |
| 6,232,990 B1 | 5/2001 | Poirion |
| 6,246,347 B1 | 6/2001 | Bakhmutsky |
| 6,298,438 B1 * | 10/2001 | Thayer et al. ............... 712/226 |
| 6,529,554 B1 * | 3/2003 | Craver .................. 375/240.23 |
| 2003/0146858 A1 * | 8/2003 | Chen et al. .................... 341/63 |

OTHER PUBLICATIONS

Linley Gwennap, "MediaGX Targets Low–Cost PCs", *Microprocessor Report*, vol. 11, No. 3, Mar. 10, 1997, pp. 1–8.

*Proposed SMPTE Standard for Television, SMPTE 314M*, pp. 1–46.

*AltiVec Technology, Programming Interface Manual*, Motorola, Rev. 0, Jun. 1999, p. 4–84.

*AltiVec Technology, Programming Environments Manual*, Motorola, Rev. 0, Nov. 1998, pp. 1–1—1–12, p. 6–113.

* cited by examiner

*Primary Examiner*—Howard L. Williams
(74) *Attorney, Agent, or Firm*—Blakely, Sokoloff, Taylor & Zafman LLP

(57) ABSTRACT

Methods and apparatuses for run length encoding using a vector processing unit. In one aspect of the invention, a method for execution by a microprocessor in response to the microprocessor receiving a single instruction includes: receiving a first list of a plurality of elements from a first vector register; generating a plurality of run values respectively for the first list of elements, at least one of the plurality of run values indicating the number of consecutive elements of a first value immediately preceding the corresponding element in the first list; and outputting the plurality of run values into a second vector register; where the above operations are performed in response to the microprocessor receiving the single instruction.

53 Claims, 30 Drawing Sheets

Figure 6:
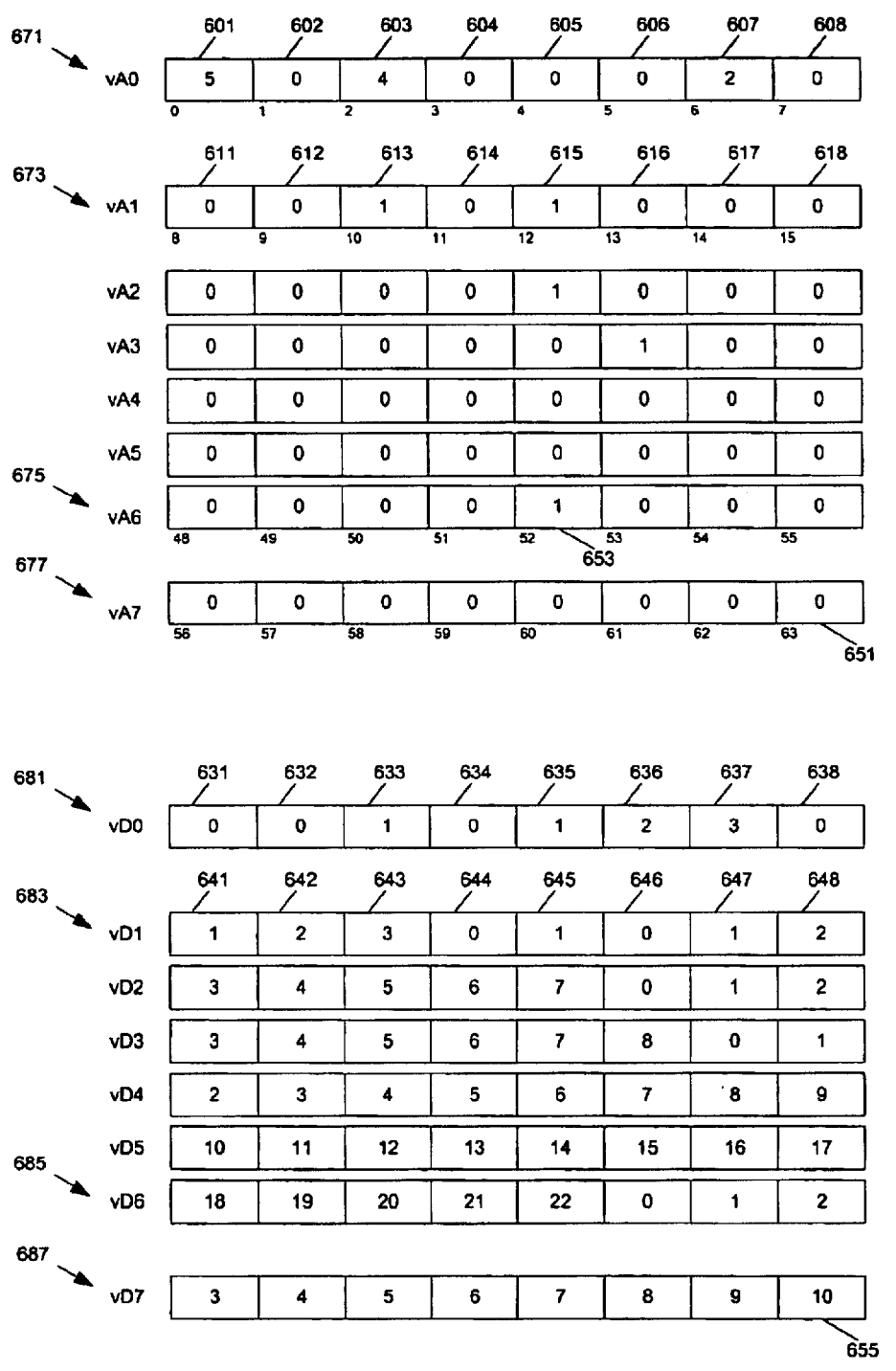

| | | 601 | 602 | 603 | 604 | 605 | 606 | 607 | 608 |
|---|---|---|---|---|---|---|---|---|---|
| 671 → | vA0 | 5 | 0 | 4 | 0 | 0 | 0 | 2 | 0 |
| | | 0 | 1 | 2 | 3 | 4 | 5 | 6 | 7 |
| | | 611 | 612 | 613 | 614 | 615 | 616 | 617 | 618 |
| 673 → | vA1 | 0 | 0 | 1 | 0 | 1 | 0 | 0 | 0 |
| | | 8 | 9 | 10 | 11 | 12 | 13 | 14 | 15 |
| | vA2 | 0 | 0 | 0 | 0 | 1 | 0 | 0 | 0 |
| | vA3 | 0 | 0 | 0 | 0 | 0 | 1 | 0 | 0 |
| | vA4 | 0 | 0 | 0 | 0 | 0 | 0 | 0 | 0 |
| | vA5 | 0 | 0 | 0 | 0 | 0 | 0 | 0 | 0 |
| 675 → | vA6 | 0 | 0 | 0 | 0 | 1 | 0 | 0 | 0 |
| | | 48 | 49 | 50 | 51 | 52 | 53 | 54 | 55 |
| 677 → | vA7 | 0 | 0 | 0 | 0 | 0 | 0 | 0 | 0 |
| | | 56 | 57 | 58 | 59 | 60 | 61 | 62 | 63 |

| | | 631 | 632 | 633 | 634 | 635 | 636 | 637 | 638 |
|---|---|---|---|---|---|---|---|---|---|
| 681 → | vD0 | 0 | 0 | 1 | 0 | 1 | 2 | 3 | 0 |
| | | 641 | 642 | 643 | 644 | 645 | 646 | 647 | 648 |
| 683 → | vD1 | 1 | 2 | 3 | 0 | 1 | 0 | 1 | 2 |
| | vD2 | 3 | 4 | 5 | 6 | 7 | 0 | 1 | 2 |
| | vD3 | 3 | 4 | 5 | 6 | 7 | 8 | 0 | 1 |
| | vD4 | 2 | 3 | 4 | 5 | 6 | 7 | 8 | 9 |
| | vD5 | 10 | 11 | 12 | 13 | 14 | 15 | 16 | 17 |
| 685 → | vD6 | 18 | 19 | 20 | 21 | 22 | 0 | 1 | 2 |
| 687 → | vD7 | 3 | 4 | 5 | 6 | 7 | 8 | 9 | 10 |

| Index | Codeword [0:15]<br>(e.g., bits [0:7] stored in LUT0, LUT3)<br>(e.g., bits [8:15] stored in LUT1, LUT4) | Codeword Length [16:19]<br>(e.g., bits [16:19] stored in<br>LUT2, LUT5) | addSign [20:20]<br>(e.g., bit [20:20] stored in<br>LUT2, LUT5) |
|---|---|---|---|
| 0 | 16b'xx00 0000 0000 0000 | 2 | 1 |
| 1 | 16b'xxx0 0000 0000 0000 | 3 | 1 |
| 2 | 16b'xxxx 0000 0000 0000 | 4 | 1 |
| 3 | 16b'xxxx 0000 0000 0000 | 4 | 1 |
| 4 | 16b'xxxx 0000 0000 0000 | 4 | 1 |
| ⋮ | ⋮ | ⋮ | ⋮ |
| 511 | ... | ... | 1 |

VECTOR HANDLING CAPABLE PROCESSOR AND RUN LENGTH ENCODING

FIELD OF THE INVENTION

The invention relates to data processing systems using vector processing and Very Long Instruction Word (VLIW) architecture, more particularly to run length encoding.

BACKGROUND OF THE INVENTION

A frame of image can be represented by a matrix of points referred to as pixels. Each pixel has one or more attributes representing the color associated with the pixel. Video streams are represented by consecutive frames of images. To efficiently store or transport image and video information, it is necessary to use data compression technologies to compress the data representing the attributes of each pixel of each frame of the images.

Various standards have been developed for representing image or video information in compressed formats, which includes Digital Video (DV) formats, MPEG2 or MPEG4 formats from Moving Picture Expert Group, ITU standards (e.g., H.261 or H.263) from International Telecommunication Union, JPEG formats from Joint Photographic Expert Group, and others.

Many standard formats (e.g., DV, MPEG2 or MPEG4, H.261 or H.263) use block based transform coding techniques. For example, 8×8 two-dimensional blocks of pixels are transformed into frequency domain using Forward Discrete Cosine Transformation (FDCT). The transformed coefficients are further quantized and coded using zero run length encoding and variable length encoding.

Zero run length encoding is a technique for converting a list of elements into an equivalent string of run-level pairs, where each non-zero element (level) in the list is associated with a zero run value (run) which represents the number of consecutive elements of zero immediately preceding the corresponding non-zero element in the list. After zero run length encoding, strings of zeros in the list are represented by zero run values associated with non-zero elements. For example, the non-zero elements and their associated zero run values can be interleaved into a new list to represent the original list of elements with strings of zeros.

Variable length coding is a coding technique often used for lossless data compressing. Codes of shorter lengths (e.g., Huffman codewords) are assigned to frequently occurring fixed-length data (or symbols) to achieve data compression. Variable length encoding is widely used in compression video data.

After the Forward Discrete Cosine Transformation and quantization, the frequency coefficients are typically reordered in a zigzag order so that the zero coefficients are grouped together in a list of coefficients, which can be more effectively encoded using a zero run length encoding technique. The energy of a block of pixels representing a block of image is typically concentrated in the lower frequency area. When the coefficients are reordered in a zigzag order, the coefficients for the lower frequencies are located relatively before those for higher frequencies in the reordered list of coefficients. Thus, non-zero coefficients are more likely to concentrate in the front portion of the reordered coefficient list; and zero coefficients are more likely to concentrate in the end portion of the reordered list.

Since compressing images is a computational intensive operation, it is desirable to have highly efficient methods and apparatuses to perform run length encoding and variable length encoding.

SUMMARY OF THE DESCRIPTION

Methods and apparatuses for run length encoding using a vector processing unit are described here.

In one aspect of the invention, a method for execution by a microprocessor in response to the microprocessor receiving a single instruction includes: receiving a first list of a plurality of elements from a first vector register; generating a plurality of run values respectively for the first list of elements, at least one of the plurality of run values indicating the number of consecutive elements of a first value immediately preceding the corresponding element in the first list; and outputting the plurality of run values into a second vector register; where the above operations are performed in response to the microprocessor receiving the single instruction. In one example according to this aspect, the method further includes: receiving a second element before generating the plurality of run values. The second element indicates the number of consecutive elements of the first value immediately preceding a first element in a second list of elements, in which the first element immediately precedes the first list of elements. Each of the plurality of run values indicates the number of consecutive elements of the first value in the second list immediately preceding a corresponding element in the second list. In one example, the first value is zero; and the instruction is for computing zero run values of a vector of elements in a list of elements.

In another aspect of the invention, a method to perform zero run length encoding includes: computing the run value of the last element of a list of elements; computing a first index pointing to the fast non-zero element in the list from an index indicating the number of elements in the list and the run value of the last element; and processing elements of the list to zero run length encode the list of elements until the last non-zero element indicated by the first index is zero run length encoded without going through elements located after the last non-zero element in the list. Methods according to this aspect can be used in encoding images stream in accordance with MPEG2, MPEG4, DV, H.261, H.263 and other standards.

The present invention includes apparatuses which perform these methods, include data processing systems which perform these methods, and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

FIG. 6 illustrates an example to compute zero run values.

FIG. 14 illustrates data representations of a look up table which can be used with the instructions to variable length encode a plurality of symbols according to one embodiment of the present invention.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Figure 1:
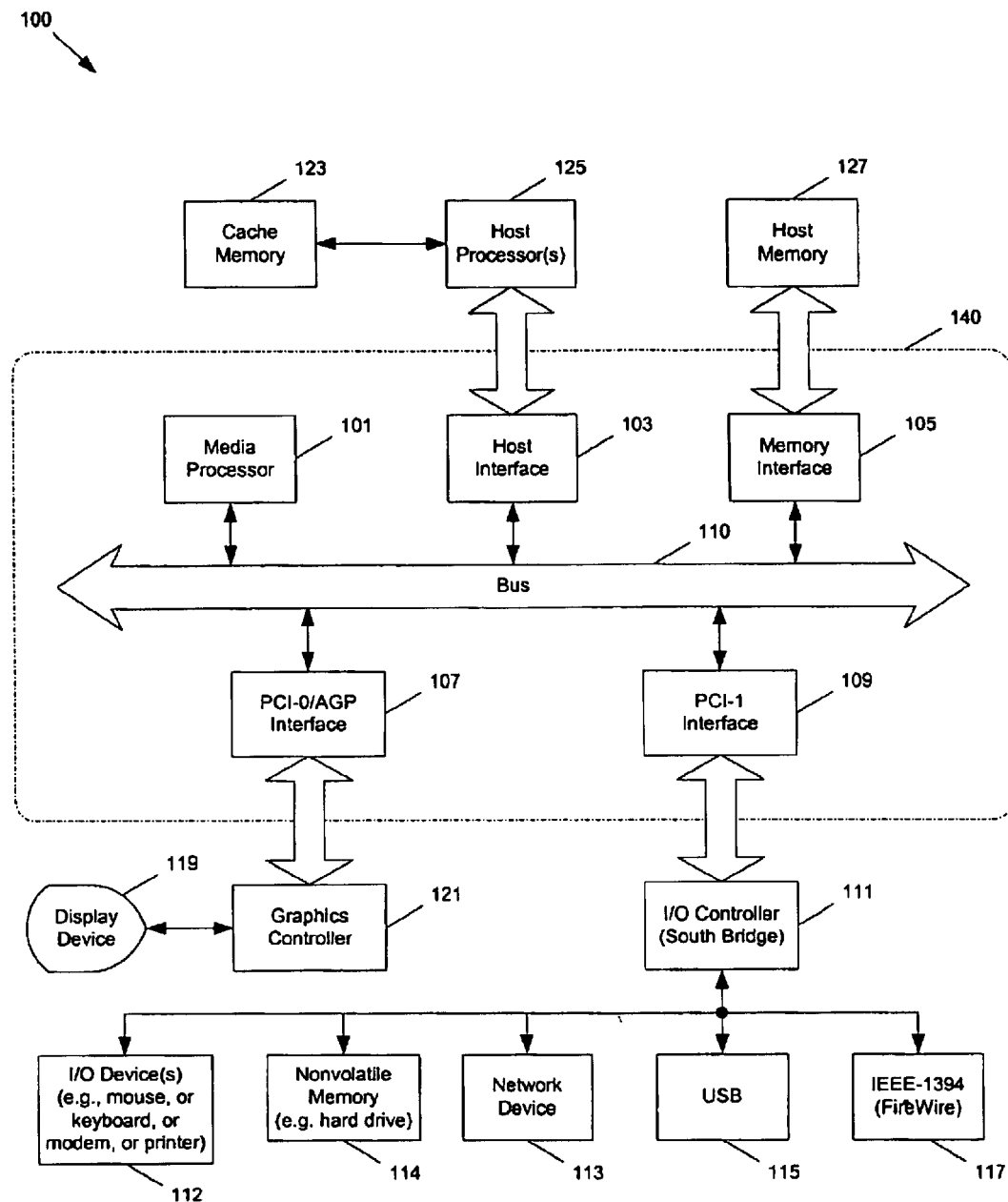
FIG. 1 shows a configuration of a computer system, which may be used by the present invention.

FIG. 1 shows a configuration of a computer system, which may be used by the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention.

As shown in FIG. 1, the computer system 100, which is a form of a data processing system, includes bus 10 which interconnects PCI (Peripheral Component Interface) interfaces 107 and 109, host interface 103, and memory interface 105. System core logic 140, known as north bridge, interconnects host processor(s) 125, host memory 127, graphics controller (or display controller) 121, and Input/Output (I/O) controller 111 through host interface 103, memory interface 105 and PCI interfaces 107 and 109 respectively. Cache memory 123 is coupled to host processor(s) 125 to provide fast access to frequently used data to host processor(s) 125. IO controller 111 may include additional system logic, known as south bridge, which further provides connectivity to various devices, such as I/O devices 112 (e.g., mouse, keyboard, modem, or printer), nonvolatile memory 114 (e.g., hard drive, floppy drive, CD/DVD/CD-R/CD-RW drive), network device 113 (e.g., Ethernet interface), universal serial bus (USB) 115, and FireWire 117. Various devices in accordance with USB or IEEE-1394 (FireWire) standards may be attached to USB 115 or FireWire 117; and various display devices may be attached to graphics controller 121. FireWire is one of the standards that support very fast communications for peripheral devices and is very suitable for connecting multimedia peripheral devices (e.g., video camcorders) and other high-speed devices (e.g., hard disk drives and printers). While FIG. 1 shows that the nonvolatile memory is a local device coupled directly to the rest of the components in the data processing system, it will be appreciated that the present invention may utilize a nonvolatile memory which is remote from the system, such as a network storage device which is coupled to the data processing system through a network interface such as a modem or Ethernet interface.

In one embodiment of the present invention, system core logic 140 further includes media processor 101; and the components of system core logic 140 are integrated in a single-chip chipset. More details of a media processor integrated in a system core logic chip are described in a co-pending U.S. patent application, Ser. No. 10/038,700, entitled "Bus Controller Chipset" by Joseph P. Bratt, et al, which application is hereby incorporated here by reference. In another embodiment, a single-chip system logic chipset further includes interfaces to other system logics, such as universal serial bus (USB), Ethernet device, etc. However, in other embodiments, media processor 101 is not integrated in a system core logic chip, or not used (in which case the methods and apparatuses of the present invention can be implemented in at least one host processor).

In FIG. 1, media processor 101 communicates with host processor(s) 125 through host interface 103. Media processor 101 processes data autonomously and asynchronously to host processor(s) 125. An interrupt mechanism controlled by software is used for the communication between media processor 101 and host processor(s) 125. Alternatively, a media processor may process data as a co-processor and be synchronized to the host processor(s).

Various methods and apparatuses of the present invention can be implemented in either media processors (e.g., media processor 101) or in host processors (e.g., host processor 125).

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as memory 127, non-volatile memory 114, cache 123, local memory located inside media processor 101 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as host processor(s) 125 or media processor 101.

Figure 2:
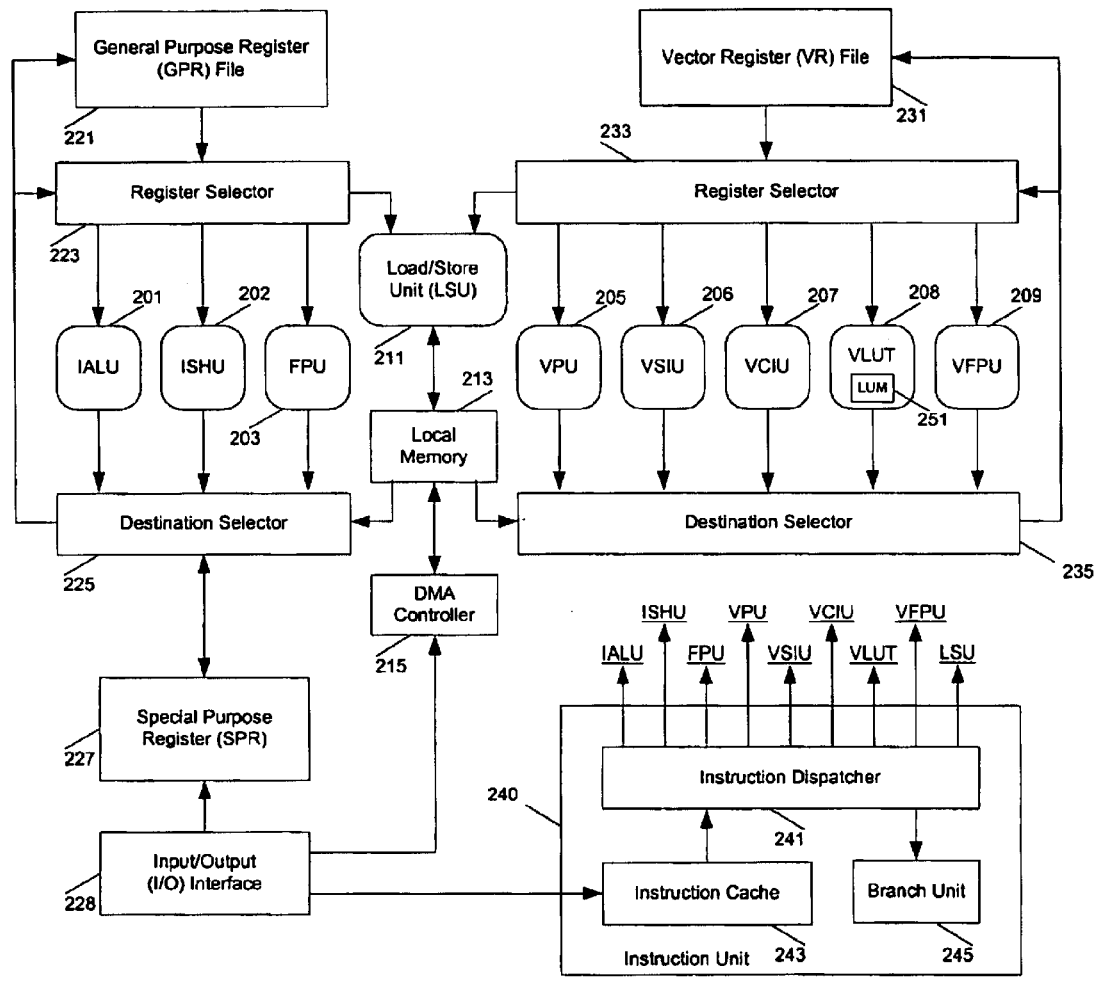
FIG. 2 shows a VLIW processing engine according to one embodiment of the present invention.

FIG. 2 shows a Very Long Instruction Word (VLIW) processing engine according to one embodiment of the present invention. The processing engine in FIG. 2 can be viewed as a VLIW processor. Media processor 101 (or a host processor) may contain one or more such VLIW processing engines. In additional to the instructions of the present invention, the processing engine shown in FIG. 2 can execute a set of instructions, which, for example, includes a subset of AltiVec instruction sets for PowerPC processors by Motorola.

The processing engine in FIG. 2 contains a set of execution units including: integer arithmetic/logical unit (IALU) 201, integer shift unit (ISHU) 202, floating-point unit (FPU) 203, load/store unit (LSU) 211, vector permute unit (VPU) 205, vector simple integer unit (VSIU) 206, vector complex integer unit (VCIU) 207, vector look-up table unit (VLUT) 208, vector floating-point unit (VFPU) 209, and branch/instruction unit (BRU) 240. Storage elements in the processing engine include: general purpose register file (GPR) 221, vector register file (VR) 231, look-up memory (LUM) 251 (located inside VLUT 208), local memory 213, instruction cache 243, and special purpose registers (SPR) 227. An entry in the vector register file is a vector register; and an entry in the general purpose register file is a scalar register. It is useful to note that a processing engine may contain more or less execution units as shown in FIG. 2. More than one functional unit of a kind may be included. For example, in one embodiment, a processing engine may contain one IALU, two ISHU, one LSU, and one BRU units.

Load/Store Unit (LSU) 211 is coupled to register selectors 223 and 233 for saving data from registers files 221 and 231 to local memory 213 and coupled to destination selectors 225 and 235 for loading data from local memory 213 to register files 221 and 231. Direct Memory Access (DMA) controller 215 is coupled to local memory 213 for transporting data between local memory 213 and host memory (e.g., host memory 127 in FIG. 1) through input/output (I/O) interface 228. Special purpose register (SPR) 227 is coupled to destination selectors to store results from the execution of certain instructions. I/O interface 228 provides a communication channel for accessing the fields in the special purpose register by a host processor, for transporting data between the local memory and the host memory, and for loading instructions from the host memory into the instruction cache, etc. Branch/instruction unit 240 decodes groups of instructions and sends instructions from dispatcher 241 to various execution units for execution.

Scalar execution units, e.g., IALU, ISHU, or FPU, generally receive data from and store the results of the execution into the general purpose register (GPR) file. Similarly, vector execution units, e.g., VPU, VSIU, VCIU, VLUT, or VFPU, generally receive data from and store the results of the execution into the vector register (VR) file. However, some instructions may cause a vector execution unit to read the general purpose register (GPR) file and set fields in the special purpose register (SPR).

Typically, an integer arithmetic/logic unit (e.g., IALU 221) executes simple scalar integer arithmetic (e.g., addition and subtraction, etc.), complex scalar arithmetic instructions (e.g., multiplication and division), and logical operations; an integer shift unit (e.g., ISHU 202) executes scalar bit shift and rotate operations; a floating-point unit (e.g., FPU 203) performs arithmetic operations on floating point numbers; a vector permute unit (e.g., VPU 205) executes vector permute instructions and vector byte shift/rotate instructions; a vector simple integer unit (e.g., VSIU 206) executes vector addition, subtraction and bit shifting instructions; a vector complex integer unit (e.g., VCIU 2810) executes vector multiplication, multiplication-addition, and summation (e.g., addition of more than two values) instructions; and a vector floating-point unit (e.g., VFPU 209) performs arithmetic operations on vectors of floating point numbers. Most vector operations are performed on bytes (8-bit), half-words (16-bit), or words (32-bit) stored in vector registers.

A vector look-up table unit (e.g., VLUT 208) can look up a vector of data items from a number of look-up tables simultaneously using a vector of indices. Some details of a vector look-up table unit, as well as more details of a VLIW processing engine, are described in a co-pending U.S. patent application, Ser. No. 10/038,351, entitled "Apparatus for Parallel Table Look-Up" by Joseph P. Bratt, et al, which application is hereby incorporated here by reference.

Figure 3:
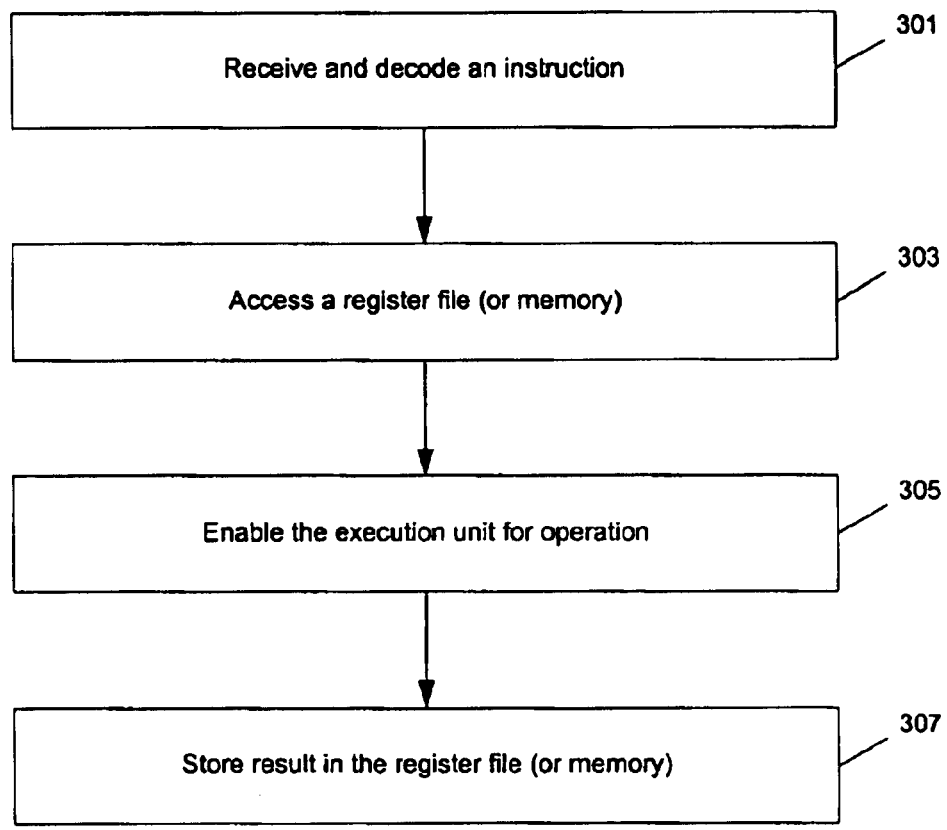
FIG. 3 shows a flow diagram illustrating the general steps used by a processor to manipulate data in executing an instruction according to one embodiment of the present invention.

FIG. 3 shows a flow diagram illustrating the general steps used by a processor to manipulate data in executing an instruction according to one embodiment of the present invention. In operation 301, an instruction decoder (e.g., instruction dispatcher 241 in FIG. 2) receives an instruction (e.g., from instruction cache 243 in FIG. 2) and decodes the instruction to determine the operations to be performed.

In operation 303, register files (e.g., general purpose register file 221, vector register file 231, special purpose register file 227 in FIG. 2) or memory (e.g., local memory 213, or host memory 127) are accessed to retrieve data required by the instruction. Direct Memory Access (DMA) controller (e.g., DMA controller 215) may be used to transfer data from (or to) host memory in operation 303.

In operation 305, the execution unit (e.g., Vector Simple Integer Unit (VSIU) 206, Vector Look up Table Unit (VLUT) 208, or Vector Complex Integer Unit (VCIU) 207) is enabled to perform the operation on the data accessed in operation 303. The result is stored into the register file (e.g., vector register file 231, special purpose register 227) or into memory (e.g., local memory 213, or host memory 127) according to the requirements of the instruction in operation 307.

In one embodiment of the present invention, data to be processed are first loaded into local memory 213. Vectors of data are loaded from the local memory into the vector register file before the execution of an instruction. After the execution of the instruction, the results in the vector register are transferred into the local memory.

At least one embodiment of the present invention seeks to compute a zero run value for each of a vector of numbers by using a single instruction in a vector execution unit such that a plurality of run values can be evaluated using a single instruction.

Figure 4:
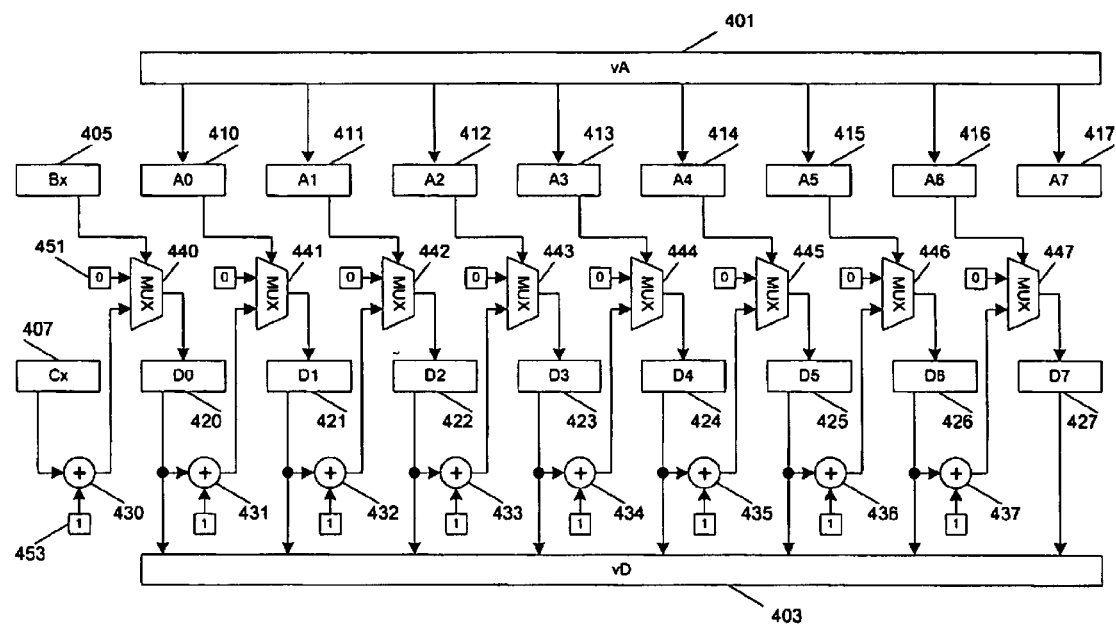
FIG. 4 shows a block diagram representation of a circuit for the execution of a method to compute zero run values for a vector of numbers.

FIG. 4 shows a block diagram representation of a circuit for the execution of a method to compute zero run values for a vector of numbers. Vector register 401 (vA) contains a vector of bit. The bit segments in vA are selected as numbers 410–417 (A0–A7). Numbers 405 (Bx) and 407 (Cx) are received from other vector registers (or from general purposed registers) to provide a reference point for the computation of run values for A0–A7 in a list, where Cx represents the run value of Bx in the list, in which A0–A7 immediately succeeds Bx. If Bx is not zero, multiplexer 440 selects zero (451) into D0 (420) as the run value for A0; otherwise, the result of adder 430, which is the sum of Cx (407) and one (453), is selected by multiplexer 440 into D0 (420) as the run value for A0. Multiplexer 441 then determines the run value for A1 (441) from the value of A0 and the run value of A0. If A0 is zero, adder 431 increase D0 by one, and the result is selected by multiplexer 441 into D1 (421) as the run value for A1; otherwise, multiplexer 441 selects zero into D1. In this fashion, adders 431–437 and multiplexers 441–447 compute run values D1–D7 for A1–A7 respectively. The run values in D0–D7 are stored into vector register 403 (vD) after the computation.

When number A0 is the first element in a list, an arbitrary non-zero number can be used as Bx so that the run value of A0 is zero.

Numbers Bx and Cx can be received from the last elements of two vector registers so that, when run values of the list of elements are evaluated using more than two vector operations for computing run values, input and output vectors in a previous operation can be used directly as input vectors for the next operation, as illustrated in the examples below.

Alternatively, since A7 is not used in the computation of the run values (D0–D7), the circuit may be modified such that Bx (405) and A0–A6 (410–416) are received from vector register 401 (vA). In such an embodiment, vector register vA contains Bx and A0–A6, instead of A0–A7.

Figure 5:
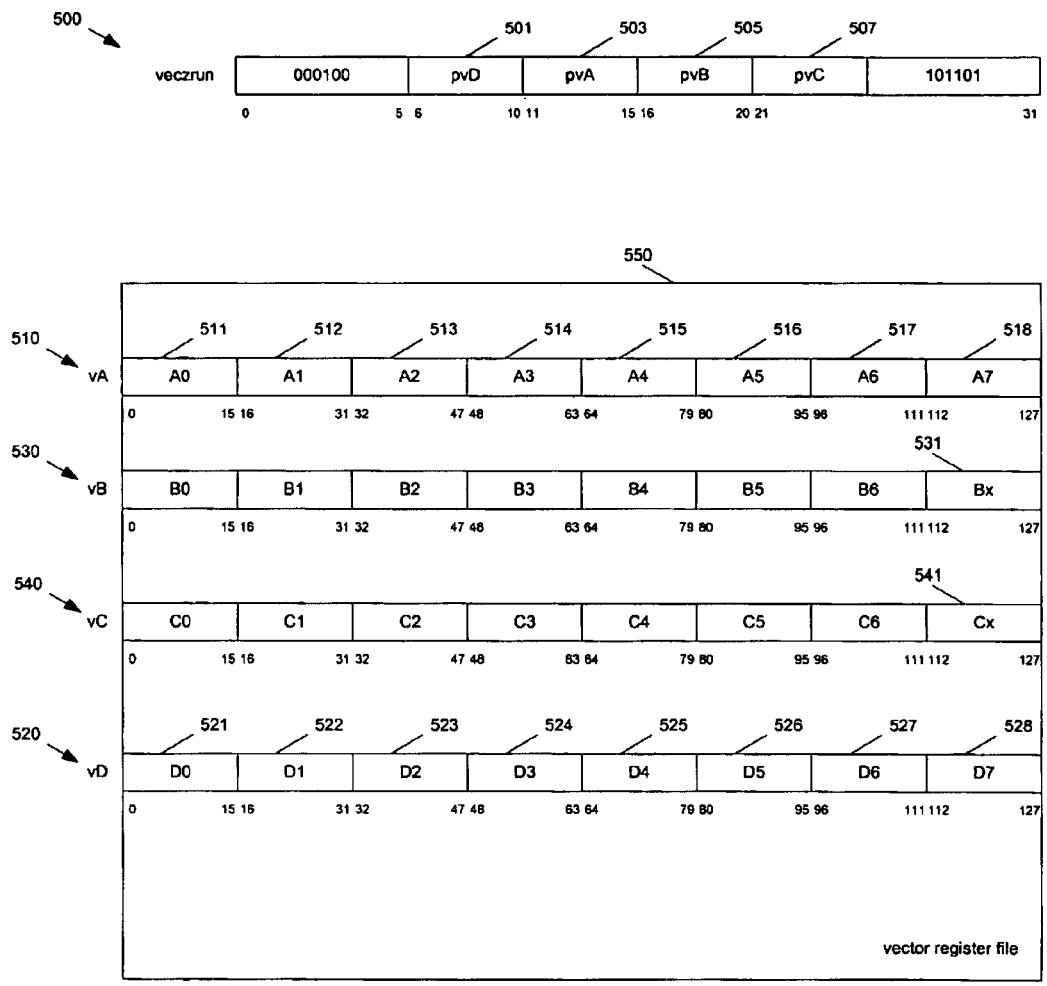
FIG. 5 illustrates data representations for the execution of an instruction for computing run values for a vector of elements in a list of elements according to one embodiment of the present invention.

FIG. 5 illustrates data representations for the execution of an instruction for computing run values for a vector of elements in a list of elements according to one embodiment of the present invention. Instruction veczrun 500 contains bit segments 501–507 for specifying the vector registers (vA, vB, vC) that contain the input data and the vector register (vD) for storing the vector of computed run values. Vector register file 550 contains entries 510, 520, 530 and 540 (vector registers vA, vD, vB and vC). Bit segments 501, 503, 505 and 507 specify respectively the locations of vector registers vD, vA, vB and vC in the vector register file. Vector register vA contains in bit segments 511–518 a vector of numbers from a list, for which the run values are computed after the execution of the instruction; and vector register vD is for storing the resulting run values. Number Bx, which immediately precedes A0 (511) in the list, is stored in bit segment 531; and its run value (Cx) is stored in bit segment 541. After the execution of the instruction, the locations of vA(510) and vD(520) can be used in the next veczrun instruction for specifying a reference point for the computation of the next vector of run values, and the data in vector registers vA and vD (e.g., bit segments 518 and 528) can be directly used to provide the reference point without further manipulation. In one embodiment of the present invention, the zero run value computing instruction is implemented using a vector simple integer unit (e.g., VSIU 206).

FIG. 6 illustrates an example to compute zero run values. The run values of the list of numbers in vectors vA0 (671), vA1 (673), . . . , vA7 (677) are computed and stored in vectors vD0 (681), vD1(683), . . . , vD7(687). To compute the first vector of run values vD0, a non-zero number is used as a reference (e.g., Bx) such that the first element 601 has a run value of zero (631). It is seen that vD0 contains a run value for each of the elements in vA0, including those which are equal to zero. For example, element 606, which is zero, has a run value of two, which indicates that there are two consecutive zero elements (elements 604 and 605) immediately preceding element 606. To compute run values in vD1, elements 608 and 638 are used as the reference point (Bx and Cx). Since element 608 is zero, one is added to run value 638 to obtain run value 641 for element 611. Thus, the run value (643) of element 613 is three, which indicates that there are three consecutive zero elements (elements 608, 611 and 612) immediately preceding element 613 in the list. Since each of the elements has a run value indicating the number of consecutive zero elements immediately preceding it in the list, an index indicating the location of the last non-zero element in the list can be determined from the number of elements in the list and the run value of the last element in the list. For example, the last element (651) in the list of elements stored in vectors vA0–vA7 is zero. The run value (655) of element 651 is 10. Thus, the last non-zero element is ten elements ahead of the last element (651) in the list. Since the number of elements in the list is 64, the index for element 651 is 63 (assuming the indices start from 0). Thus, the index for the last non-zero element (653) is 63−10−1=52.

Figure 7:
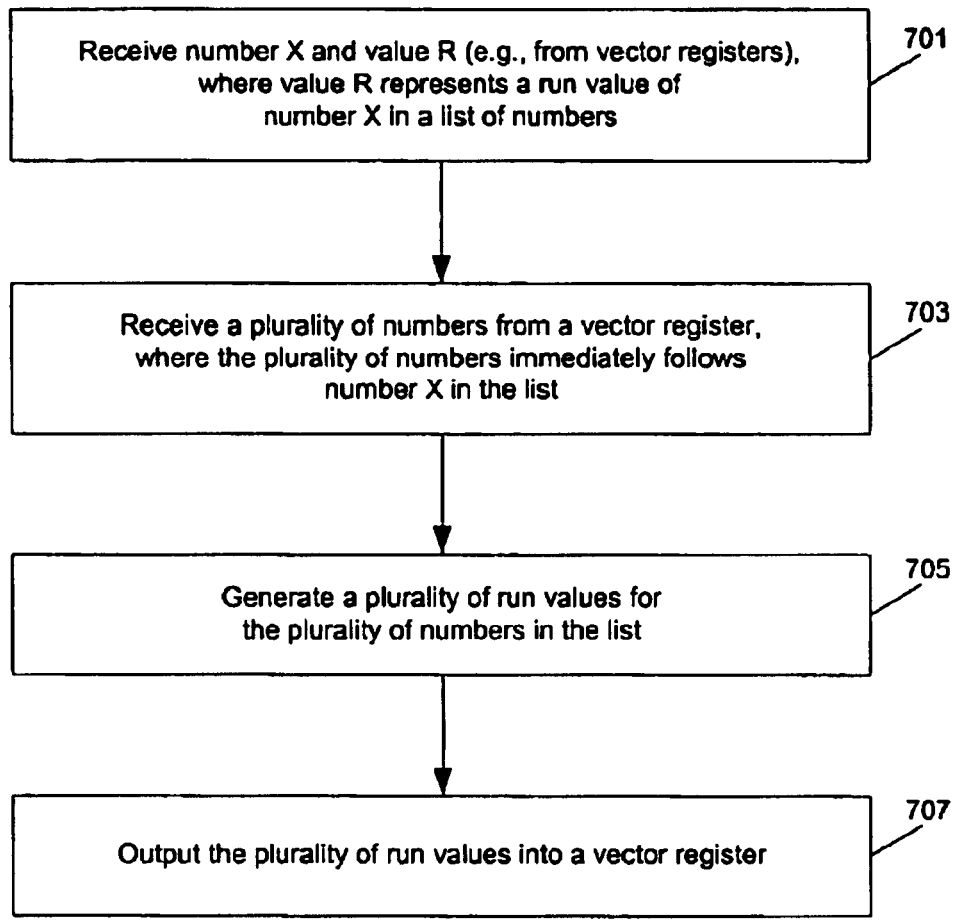
FIG. 7 shows a flow diagram for a method to compute zero run values for a vector of elements according to one embodiment of the present invention.

FIG. 7 shows a flow diagram for a method to compute zero run values for a vector of elements according to one embodiment of the present invention. In operation 701, information about a reference point is received in terms of number X and value R, where value R represents the run value of number X in a list of numbers. Number X and value R can be received from vector registers (e.g., vB and vC in vector register file 550 in FIG. 5) in one embodiment of the present invention, or be received from general purpose registers in alternative embodiments. In operation 703, a vector of numbers, which follows immediately after number X in the list of numbers, are received from a vector register. In operation 705, a run value is computed for each of the vector of numbers to indicate the number of consecutive elements of a specific value (e.g., zero) immediately preceding the corresponding element of the vector in the list. The computed run values are stored into a vector register in operation 707. In one embodiment, the computed run values can be saved into the same vector register that is used to provide value R.

Figure 8:
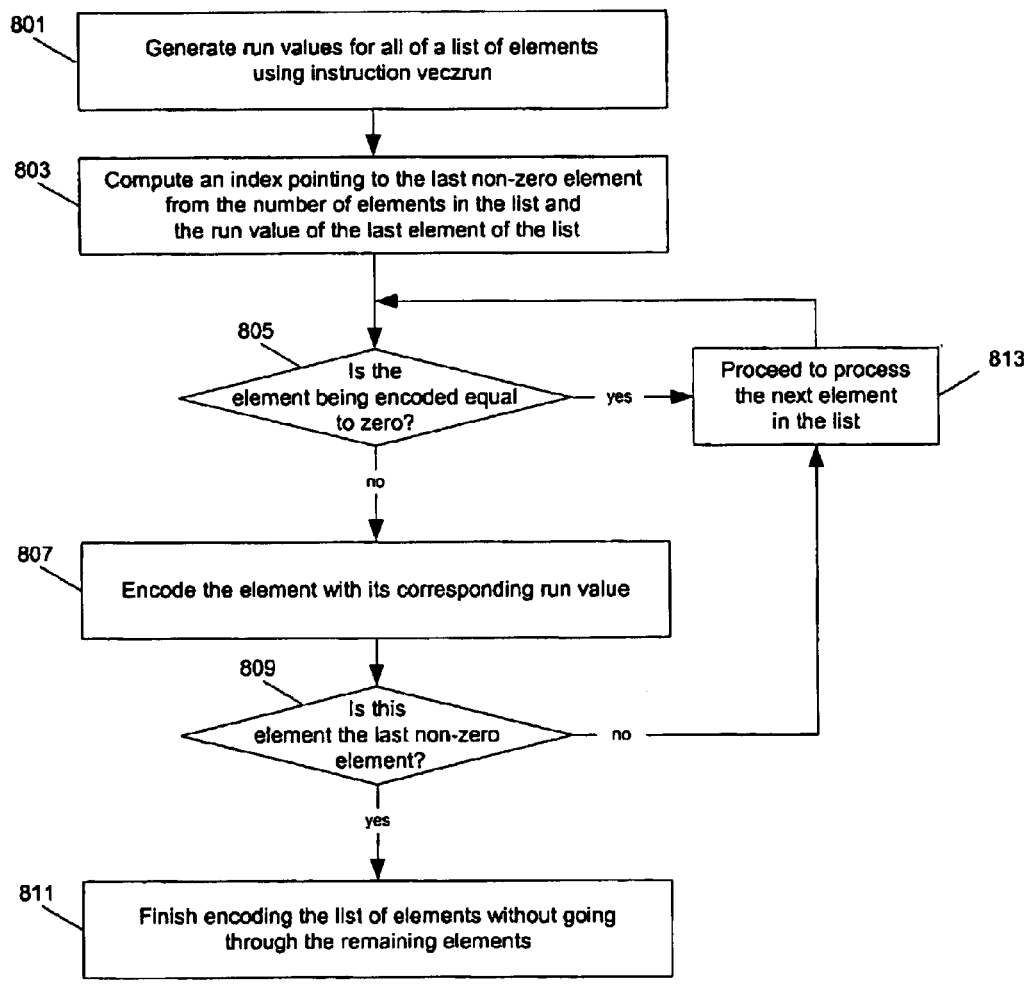
FIG. 8 shows a flow diagram for a method to zero run length encode a list of elements according to one embodiment of the present invention.

FIG. 8 shows a flow diagram for a method to zero run length encode a list of elements according to one embodiment of the present invention. In operation 801, a run value is generated for each of a list of elements (e.g., using vector operations as illustrated in FIGS. 4–7 or the method in FIG. 9). An index pointing to the last non-zero element in the list can then be computed from the number of elements in the list and the run value of the last element of the list in operation 803. The elements in the list can be zero run length encoded using the computed run values. If operation 805 determines that an element being encoded is equal to zero, operation 813 is used to skip this element and to process the next element in the list; otherwise, operation 807 is used to encode the element with its corresponding run value. In some embodiments, operation 807 includes variable length encoding for the non-zero element and its run value. If operation 809 determines that the element encoded in operation 807 is the last non-zero element, operation 811 is used to finish encoding the list of elements without going through the remaining elements in the list, since the remaining elements are all zeros. For example, a symbol for end-of-block (EOB) may be used to terminate the encoded list. If operation 809 determines that the element encoded in operation 807 is not the last non-zero element, operation 813 proceeds to process the next element in the list. The method shown in FIG. 8 can be used to run length encode image data in accordance with JPEG, MPEG2, MPEG4, DV, H.261, H.263, or other formats with zero run length.

Figure 9:
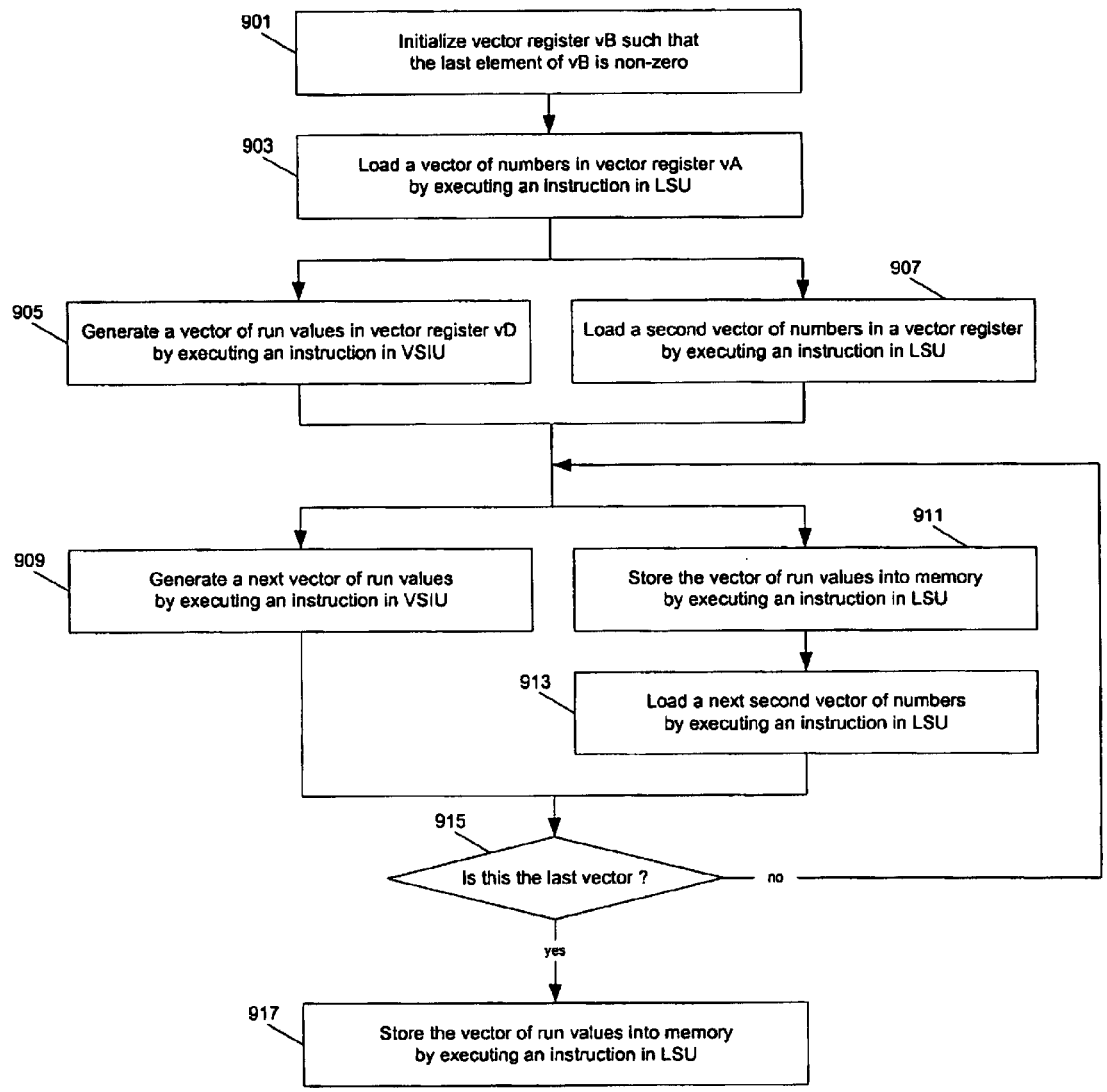
FIG. 9 shows a flow diagram for a method to compute zero run values for a list of elements according to one embodiment of the present invention.

FIG. 9 shows a flow diagram for a method to compute zero run values for a list of elements according to one embodiment of the present invention. The list of numbers is broken into a number of vectors. Operation 901 initializes a vector register vB such that the last element of vB (e.g., Bx 531 in FIG. 5) is not zero in order to force the first element of the list to have a run value of zero. Operation 903 loads the first vector of numbers into vector register vA using load/store unit (LSU). While operation 905 generates a vector of run values in vector register vD using a vector simple integer unit (e.g., VSIU 206), operation 907 concurrently loads a second vector of numbers in a vector register using LSU. While operation 909 generates a next vector of run values using VSIU, LSU concurrently stores the vector of run values, generated in operation 905, into memory (e.g., local memory 213) in operation 911 and loads a next vector of numbers from memory in operation 913. If operation 915 determines that the vector processed in operation 907 is the last vector of elements, operation 917 is used to store the run values for the last vector of elements into memory; otherwise, operations 909, 911 and 913 are repeated to computer the run values for the next vector of numbers. Note that when operation 909 is used to computes the run values for the last vector of elements, operation 913 is not necessary.

Figure 10:
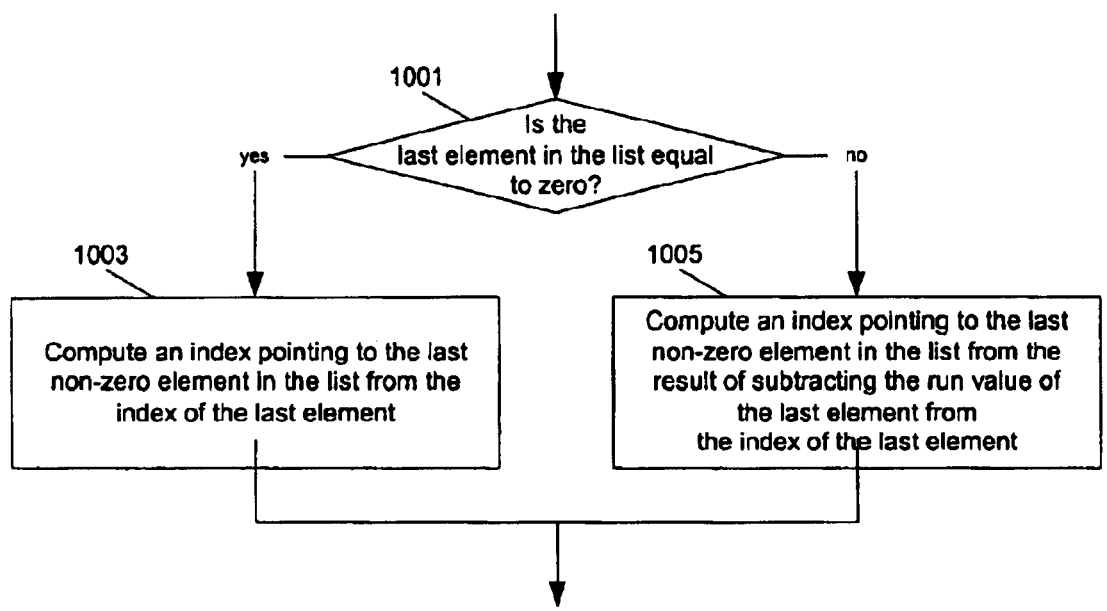
FIG. 10 shows a flow diagram for a method to compute an index pointing to the last non-zero element in a list of elements according to one embodiment of the present invention.

FIG. 10 shows a flow diagram for a method to compute an index pointing to the last non-zero element in a list of elements according to one embodiment of the present invention. If operation 1001 determines that the last element in the list is equal to zero, operation 1003 is used to compute the index pointing to the last non-zero element from the index of the last number; otherwise, operation 1005 is used to compute the index pointing to the last non-zero element from the result of subtracting the run value of the last element from the index of the last element. Alternatively, a number of zeros can be appended to a given list of elements such that the last element of the expanded list is always zero. When such an expanded list is used, only operation 1005 is necessary.

Thus, the present invention provides methods and apparatuses for efficiently perform run length encoding, which can be used for compressing images and video streams of in a variety of formats, including those in accordance with DV, MPEG2, MPEG4, H.261, H.263, and other standards.

At least one embodiment of the present invention seeks to variable length encode a plurality of symbols using a single instruction in a vector execution unit such that a plurality of codewords can be generated using a single instruction.

Zero run length encoding converts a list of elements into an equivalent string of run-level pairs. Each of the run-level pairs is a symbol, which can be converted into a variable length codeword for further lossless data compression. In video/image compression, a symbol from run length encoding with a large run value or a large absolute value for the non-zero element statistically has a low frequency of occurrence. Thus, variable length encoding can be used to further compress the run length encoded data. Most of the video/image compression standards used the run value and the absolute value of the non-zero element of a symbol to first define a codeword; and the sign bit of the non-zero element is then appended to the variable length codeword to generate the codeword for the symbol.

In the MPEG and H.26x standards, the statistical distribution of the symbols resulting from the inter-mode compression for reducing temporal redundancy in video image data is different from that for the symbols resulting from the intra-mode compression for reducing spatial redundancy in the video image data. Thus, two different variable length codeword tables are used for variable length encoding.

Figure 11:
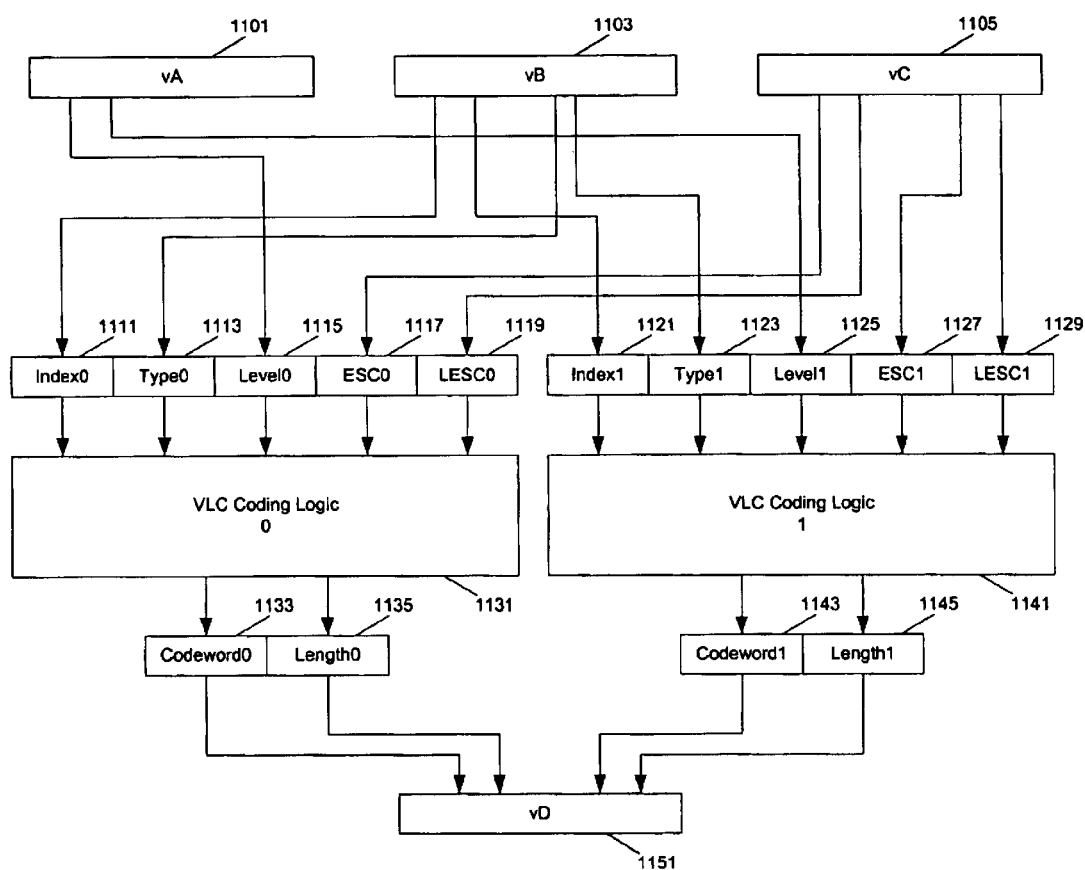
FIG. 11 shows a block diagram representation of a circuit for the execution of a method to variable length encode a plurality of symbols according to one embodiment of the present invention.

FIG. 11 shows a block diagram representation of a circuit for the execution of a method to variable length encode a plurality of symbols according to one embodiment of the present invention. Vector register vB (1103) contains bit segments representing index0 (1111) and index1 (1121). Index0 and index1 are generated from symbols to be variable length encoded so that the codewords corresponding to these symbols may be looked up from the look up tables in VLC coding logic 0 and VLC coding logic 1 (1131 and 1141) respectively. However, some symbols must be encoded using escape codes. To accommodate various escape code formats, Type0 and Type1 (1113 and 1123) from vector register vB are used to specify the types of coding operations to be performed by VLC coding logic 0 and 1. Level0 and Level1 (1115 and 1125) from the bit segments of vector register vA (1101) indicate the values of the sign bits of the corresponding symbols to be encoded. ESC0 and ESC1 (1117 and 1127) from the bit segments of vector register vC (1105) are the special codewords (e.g., escape codeword header, or escape codeword); and LESC0 and LESC1 are the bit lengths of ESC0 and ESC1 respectively. While VLC coding logic 0 (1131) processing the input parameters 1111–1119 to generate Codeword0 (1133) and its bit length Length0 (1135), VLC coding logic 1 (1141) concurrently processes the input parameters 1121–1129 to generate Codeword1 (1143) and its bit length Length0 (1145). The results (e.g., Codeword0 1133 and Length0 1135) are stored into vector register vD (1151).

In one embodiment of the present invention, a VLC coding logic performs one of four coding operations according the value specified for the type parameter (e.g., Type0 1113 or Type1 1123). These four coding operations are: i) outputting a codeword looked up from a look up table; ii) outputting the special codeword (e.g., ESC0 1117 or ESC1 1127 as the escape codeword); iii) outputting a resulting codeword from appending the codeword looked up from the look up table to the special codeword (e.g., using ESC0 1117 or ESC1 1127 as the escaped codeword header to form an escape codeword); and iv) outputting a zero as the resulting codeword.

Figure 12:
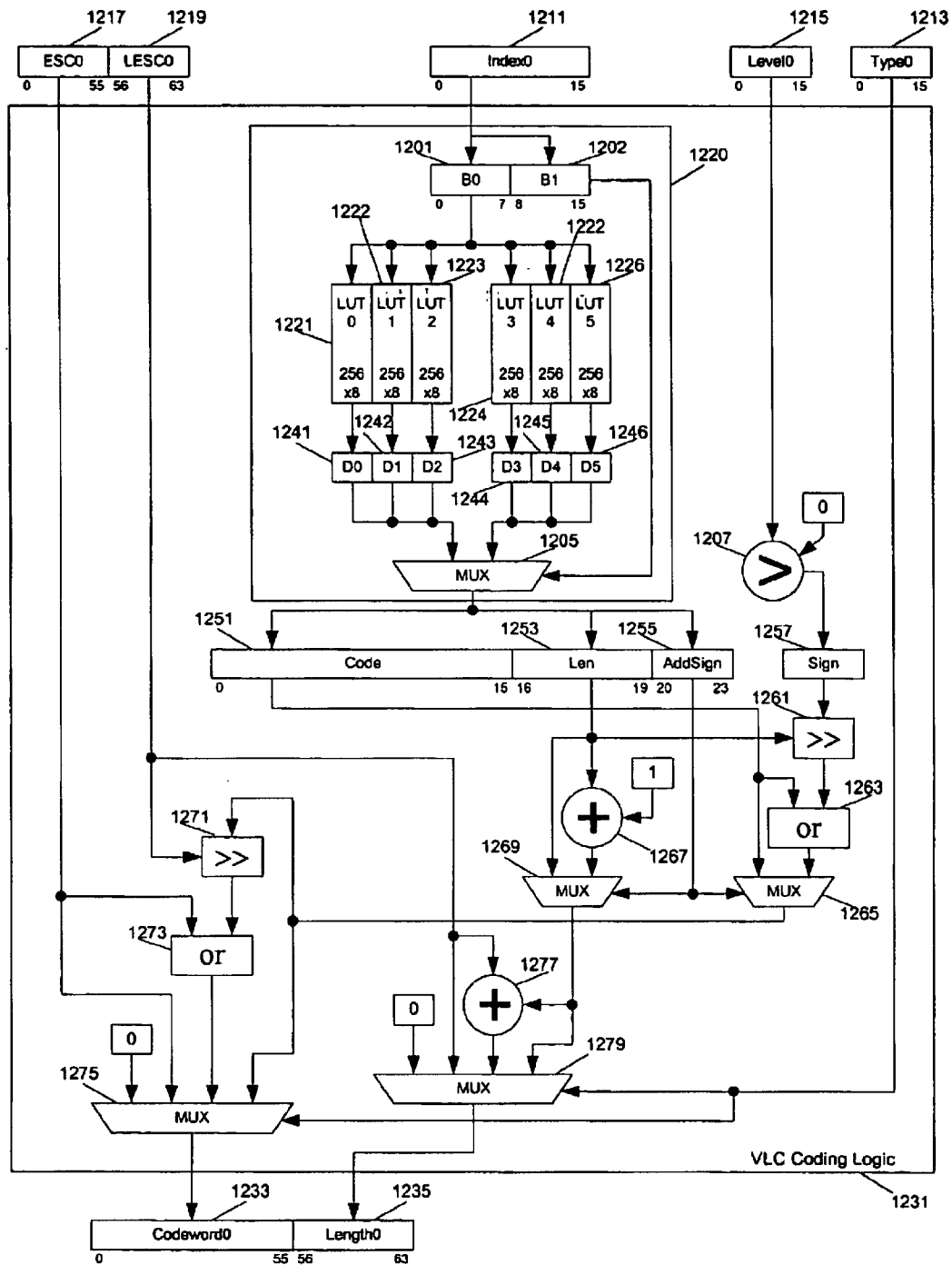
FIG. 12 shows a detailed block diagram for variable length coding logic according to one embodiment of the present invention.

FIG. 12 shows a detailed block diagram for variable length coding logic according to one embodiment of the present invention. Index0 (1211) is used in a look up table (1220) to look up an entry containing bit segments representing Code 1251, Len 1253 and AddSign 1255. In one embodiment of the present invention, the look up table is configured from a plurality of look up units. Each look up unit is a memory unit that can be individually addressed and accessed. For example, look up unit (LUT) 0 is a memory unit that has 256 8-bit entries. A number of look up units are combined to function as a single look up table. For example, LUT0, LUT1 and LUT2 (1221–1223) are combined to store the first, second, and third bytes of the first 256 24-bit entries of a look up table; and LUT3, LUT4 and LUT5 (1224–1226) are combined to store the first, second, and third bytes of the second 256 24-bit entries of the look up table. Thus, look up units 0–5 are combined to form a look up table with 512 entries. The lower 8-bit of Index0 (1211) is used as index B0 (1201) to simultaneously look up data items 1241–1246 from look up units 1221–1226. The higher 8-bit of Index0 (B1 1201) controls multiplexer 1205 to choose an entry according to whether or not Index0 (1211) is larger than 255.

Tester 1207 compares Level0 (1215) to zero to determine the state of the sign bit (Sign 1257) of the symbol to be coded. The sign bit is right shifted by shifter 1261 and appended to Code 1251 by logic OR unit 1263. AddSign (1255) causes multiplexer 1265 to select a codeword with a sign bit appended after Code (1251) when AddSign is one and to select Code (1251) from the look up table (without appending the sign bit) when AddSign is zero. Thus, multiplexer 1265 produces a codeword with or without appending the sign bit to the codeword looked up from table 1220 according to the value of AddSign 1255. Similarly, multiplexer 1269 outputs the bit length of the codeword produced by multiplexer 1265. Righter shifter 1271 and logic Or unit 1273 append to ESC0 1217 the codeword produced by multiplexer 1265; and adder 1277 computes the bit length of codeword produced by logic OR unit 1273 by summing LESC0 1217 and the bit length of the codeword produced by multiplexer 1265. Type0 (1213) controls multiplexer 1275 to select as Codeword0 (1233) from i) zero; or ii) ESC0 (e.g., using the special codeword ESC0 as the escape codeword, or a symbol for EOB); or iii) ESC0 appended with Code 1251 looked up from table 1220 with or without the sign bit appended according to AddSign (e.g., using the special codeword ESC0 as a escape header); or iv) Code 1251 looked up from table 1220 with or without the sign bit appended according to AddSign (e.g., using the look up table only). Similarly, multiplexer 1279 selects the bit length of Codeword0 (1233) as Length0 (1235).

Figure 13:
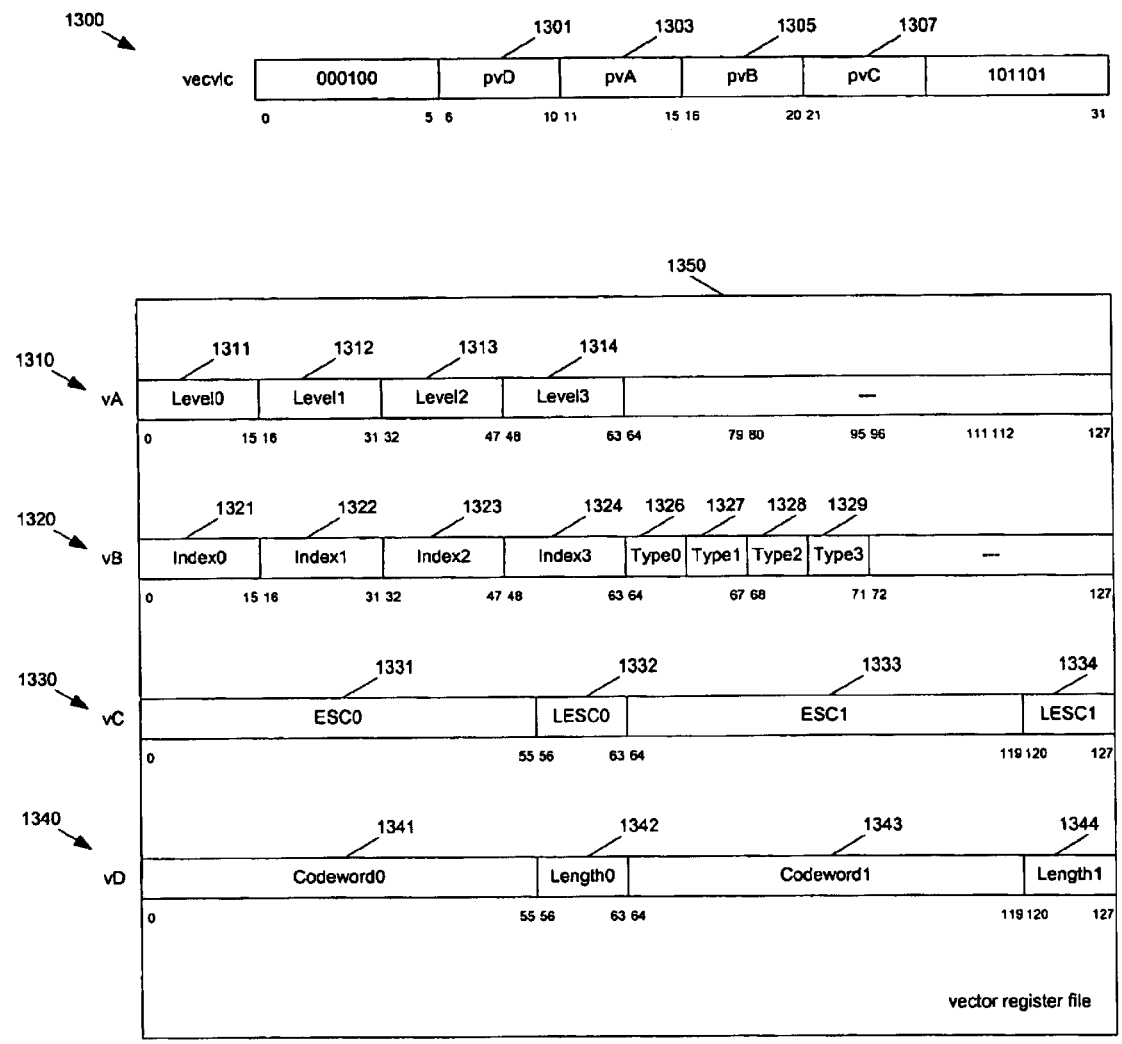
FIG. 13 illustrates data representations for the execution of an instruction to variable length encode a plurality of symbols according to one embodiment of the present invention.

FIG. 13 illustrates data representations for the execution of an instruction to variable length encode a plurality of symbols according to one embodiment of the present invention. Instruction vecvlc 1300 contains bit segments 1301–1307 for specifying the vector registers (vA, vB, vC) that contain the input data and the vector register (vD) for storing the results. Vector register file 1350 contains entries 1310, 1320, 1330, and 1340 (vector registers vA, vB, vC, and vD). Bit segments 1301, 1303, 1305 and 1307 specify respectively the locations of vector registers vD, vA, vB and vC in the vector register file. Vector register vA contains in bit segments 1311–1314 the vector of levels, which contains the values of the sign bits of the four symbols to be encodes. Vector register vB contains in bit segments 1321–1324 the vector of indices for looking up codewords from look up tables, as well as the vectors of types (in bit segments 1326–1329) for specifying the types of the coding operations, for encoding the four symbols. In one embodiment of the present invention, an execution unit contains 16 look up units; and each of the codeword look up tables contains 512 24-bit entries and, thus, requires 6 look up units. Therefore, only two symbols can be processed concurrently. Vector register vC contains bit segments 1331 and 1333 for specifying two special codewords (e.g., Escape codeword header, or Escape codeword) and bit segments 1332 and 1334 for specifying the bit lengths of the corresponding special codewords. Vector register vD contains bit segments 1341 and 1343 for storing the resulting codewords and bit segments 1342 and 1344 for storing the bit lengths of the corresponding codewords. One instruction is used for computing codewords using Level0 (1311), Level1 (1312), Index0 (1321), Index1 (1322), Type0 (1326) and Type1 (1327) from vector registers vA and vB with the input parameters in vC to generate variable length codewords for the first two symbols; and another instruction is used for computing codewords using Level2 (1313), Level3 (1314), Index2 (1323), Index3 (1324), Type2 (1328) and Type3 (1329) from vector registers vA and vB with the input parameters in vC to generate variable length codewords for the next two symbols (after the parameters in vC are updated for the next two symbols to be encoded when necessary). Since a 56-bit bit segment in input vector register vC is allocated for the storage of each of the special codewords, various formats of escape codes, end-of-block codewords, etc, can be used with instruction vecvlc.

FIG. 14 illustrates data representations of a codeword look up table which can be used with the instructions to variable length encode a plurality of symbols according to one embodiment of the present invention. Each entry of the look up table contains 16 bits for storing a codeword (bits [0:15]), 4 bits for storing a codeword length (bits [16:19]) and 1 bit for an AddSign bit. When a look up table is configured from six look up units (LUT0–LUT5), each of which contains 256 8-bit entries, bits [0:7] of entries 0–255 are stored in LUT0; bits [8:15] of entries 0–255 are store in LUT1; and bits [16:20] of entries 0–255 are stored in LUT2; bits [0:7] of entries 256–511 are stored in LUT3; bits [8:15] of entries 256–511 are store in LUT4; and bits [16:20] of entries 256–511 are stored in LUT5. Such a look up table can hold variable length codeword tables for both the inter-mode compression and the intra-mode compression in accordance with MPEG (or H.26x) standard. It can hold reversible variable length codeword table for compression in accordance with MPEG4 as well. Thus, it can hold variable length codeword tables to perform variable length encoding in accordance with DV, MPEG2, MPEG4, H.261, H.263, and other standards.

Figure 15:
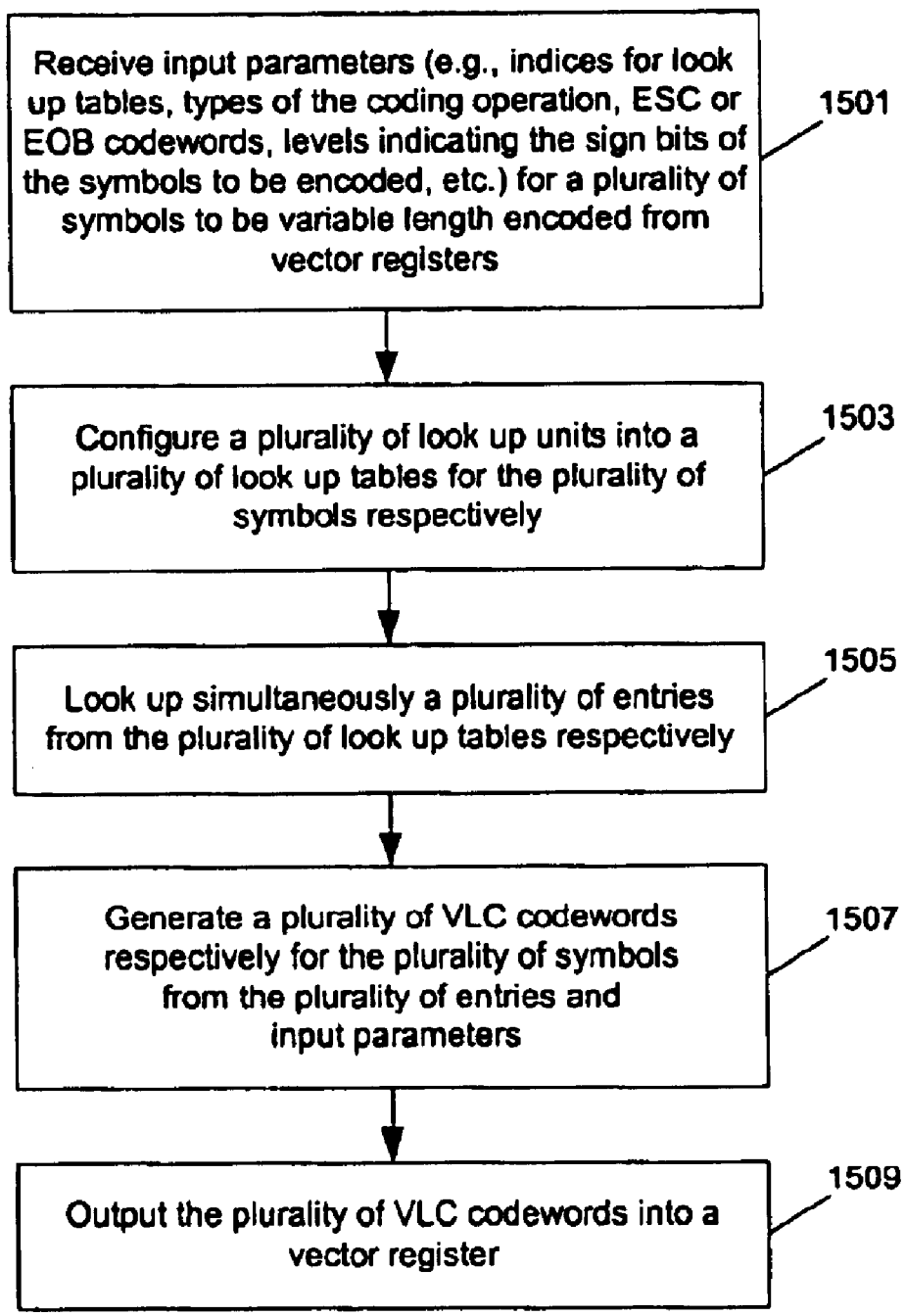
FIG. 15 shows a flow diagram for a method to variable length encode a plurality of symbols according to one embodiment of the present invention.

FIG. 15 shows a flow diagram for a method to variable length encode a plurality of symbols according to one embodiment of the present invention. Operation 1501 receives from vector registers input parameters (e.g., indices for look up tables, types of coding operations, special codewords and their lengths, sign bit indicators, etc) for a plurality of symbols to be variable length encoded. Operation 1503 configures a plurality of look up units to function as a plurality of look up tables for looking up codewords for the plurality of symbols respectively. Each of the look up tables may utilize more than one look up tables. Operation 1505 looks up simultaneously a plurality of entries from the plurality of look up tables respectively. When more than one look up units are combined to function as a look up table, look-up results from these look up units are combined to form a entry looked up from the look up table. The plurality of entries and the input parameters are combined to generate a plurality of variable length codewords for the plurality of symbols respectively in operation 1507. The plurality of variable length codewords are output into a vector register in operation 1509.

Figure 16:
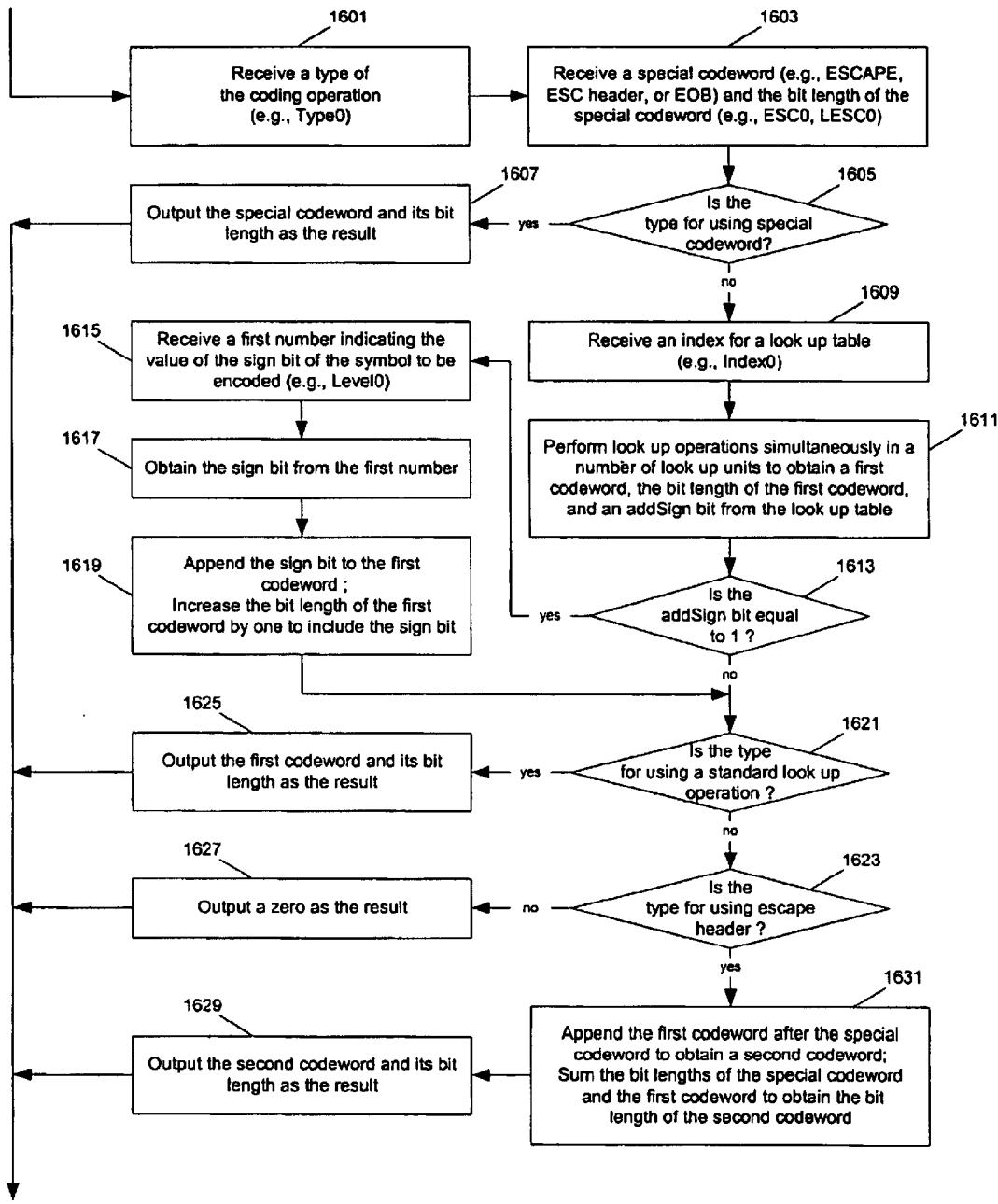
FIG. 16 shows a detailed flow diagram for a method to variable length encode a symbol according to one embodiment of the present invention.

FIG. 16 shows a detailed flow diagram for a method to variable length encode a symbol according to one embodiment of the present invention. Operation 1601 receives a type of the code operation (e.g., Type0 in FIG. 12). Operation 1603 receives a special codeword (escape codeword, escape codeword header, EOB, or others) and the bit length of the special codeword (e.g., ESC0 and LESC0 in FIG. 12). Operation 1605 determines whether or not the type (e.g., Type0) is for using the special codeword directly. When the type is for using the special codeword directly, operation 1607 outputs the special codeword and its bit length as the result. When the type is not for using the special codeword directly, operation 1609 receives an index for a codeword look up table. Operation 1611 performs look up operations simultaneously in a number of look up units to obtain results, which are combined as an entry from a look up table. The entry contains a first codeword, the bit length of the first codeword, and an AddSign bit for determining whether or not to append the sign bit of the symbol to the first codeword. When operation 1613 determines the AddSign bit is equal to 1, operation 1615 receives a first number indicating the value of the sign bit of the symbol to be encoded; operation 1617 obtains the sign bit of the symbol to be encoded from the first number; and operation 1619 appends the sign bit to the first codeword and increases the bit length of the first codeword by one to include the appended sign bit. Then, operation 1621 determines whether or not the type of operation is for using a standard look up operation. When the type is for using the codeword from a standard look up operation, operation 1625 outputs the first codeword and its bit length as the result; otherwise, operation 1623 determines whether or not the type is for using the special codeword as an escape header. When the type is for using the special codeword as an escape header, operation 1631 appends the first codeword after the special codeword to obtain a second codeword and sums the bit lengths of the special codeword and the first codeword to obtain the bit length of the second codeword; and operation 1629 outputs the second codeword and its bit length as the result. Otherwise, the type is for generating a zero as the result; and operation 1627 outputs a zero.

Figure 17:
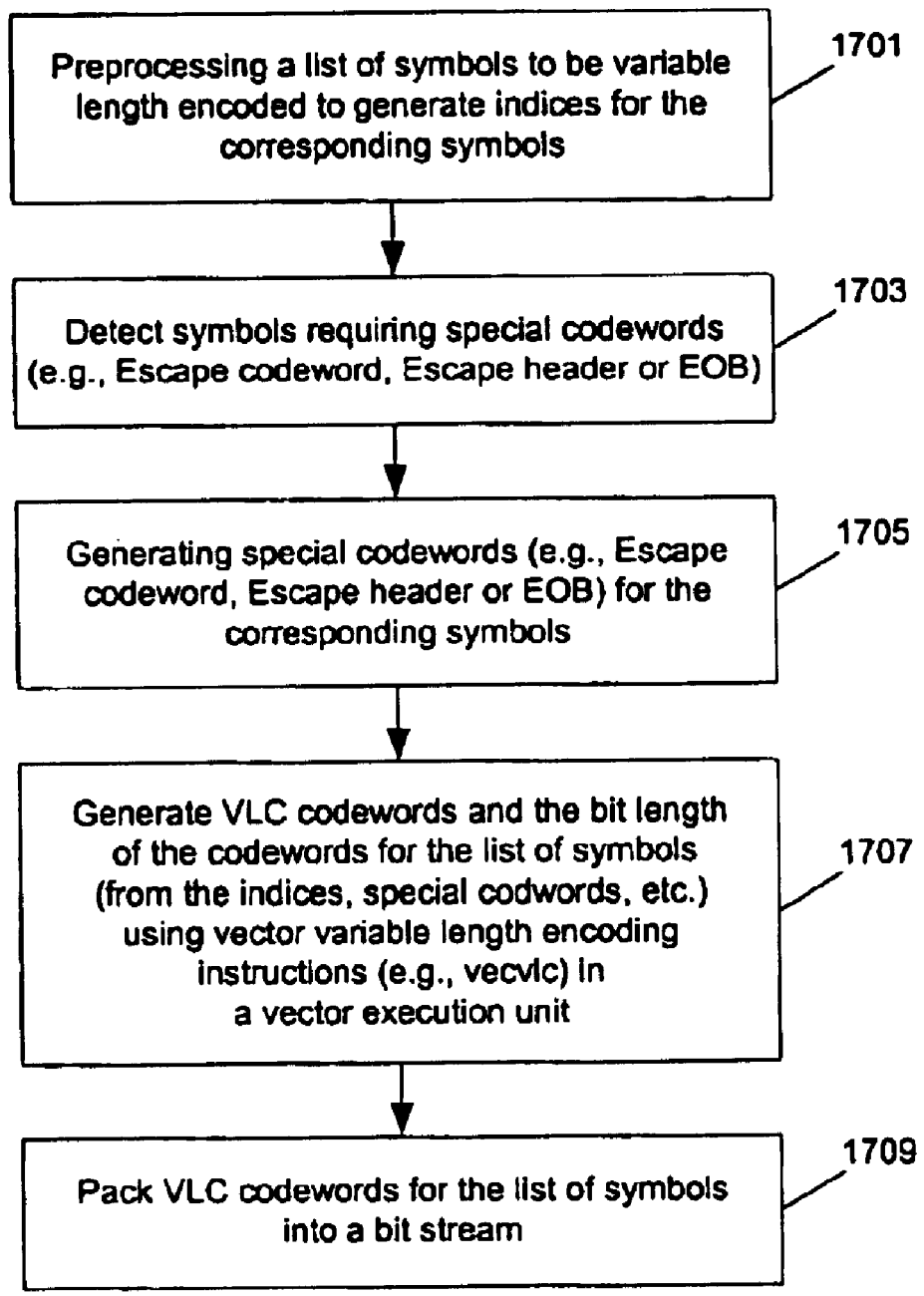
FIG. 17 illustrates a flow diagram for a method to variable length encode a plurality of symbols according to one embodiment of the present invention.

FIG. 17 illustrates a flow diagram for a method to variable length encode a plurality of symbols according to one embodiment of the present invention. Operation 1701 pre-processes a list of symbols to be variable length encoded to generate indices for the corresponding symbols. Operation 1703 detects symbols that require special codewords, for example, an escape codeword, an escape codeword header, a symbol for EOB, or others; and operation 1705 generates the special codewords for the corresponding symbols. Operation 1707 generates variable length codewords for the list of symbols (e.g., using vector variable length encoding instructions vecvlc) using a vector execution unit. In one embodiment of the present invention, indices and sign indicators for four symbols to be encoded are loaded into vector registers (e.g., vA 1310 and vB 1320 in FIG. 13). The special codewords for the first two of the symbols are loaded in another vector register (e.g., vC 1330); and one variable length encoding instruction is used to encode the first two of the symbols. Then, the special codewords for the second two of the symbols are loaded in a vector register; and another variable length encoding instruction is used to encode the second two of the symbols. Operation 1709 packs the generated variable length codewords for the list of symbols into a bit stream. More details about packing variable length codewords into a bit stream are described further below.

Thus, the present invention provides methods and apparatuses for efficiently perform variable length encoding using a vector execution unit, which can be used for compressing images and video streams of in a variety of formats, including those in accordance with DV, MPEG2, MPEG4, H.261, H.263, and other standards.

At least one embodiment of the present invention seeks to concatenate a plurality of variable length codewords using a single instruction in a vector execution unit such that a plurality of codewords can be concatenated into a bit stream in a vector register using a single instruction.

Figure 18:
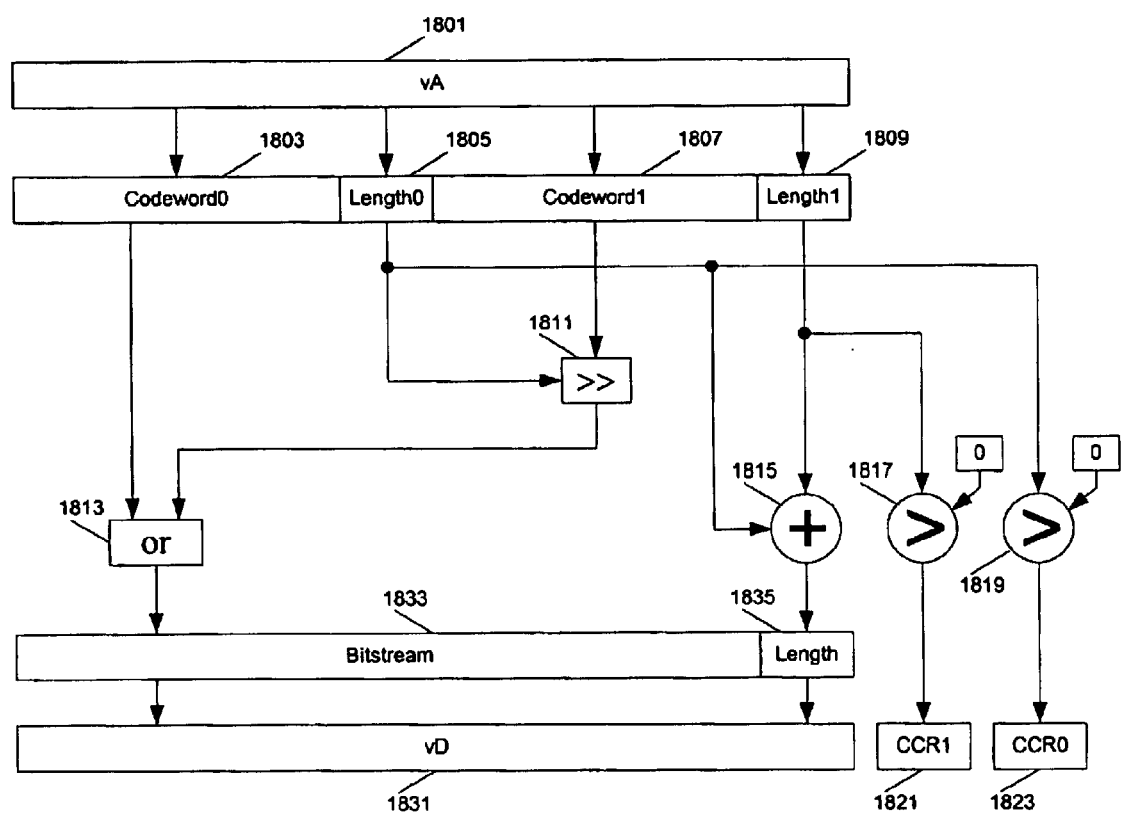
FIG. 18 shows a block diagram representation of a circuit for the execution of a method to concatenate a plurality of variable length codewords according to one embodiment of the present invention.

FIG. 18 shows a block diagram representation of a circuit for the execution of a method to concatenate a plurality of variable length codewords according to one embodiment of the present invention. Vector register vA (1801) contains bit segments representing Codeword0 (1803), Codeword1 (1807) and their bit lengths (Length0 1805 and Length1 1809). While right shifter 1811 and logic Or Unit 1813 append Codeword1 (1807) after Codeword0 (1813) to concatenate the two codewords into bit stream 1833, concurrently, adder 1815 sums the bit lengths of Codeword0 and Codeword1 (Length0 1805 and Length1 1809) to compute the bit length (Length 1835) of the resulting bit stream (1833); and testers 1817 and 1819 determine whether the bit lengths of the input codewords (Codeword0 and Codeword1) are larger than zero. When Length0 (1805) for Codeword0 (1803) is zero, bit CCR0 (1823) in a condition register (e.g., special purpose register 227 in FIG. 2) is set to zero, otherwise, CCR0 (1823) is set to one. Similarly, bit CCR1 (1821) in the condition register is set to indicate whether or not Length1 (1809) is zero. The resulting bit stream (1833) and its bit length are stored in vector register vD (1831).

Figure 19:
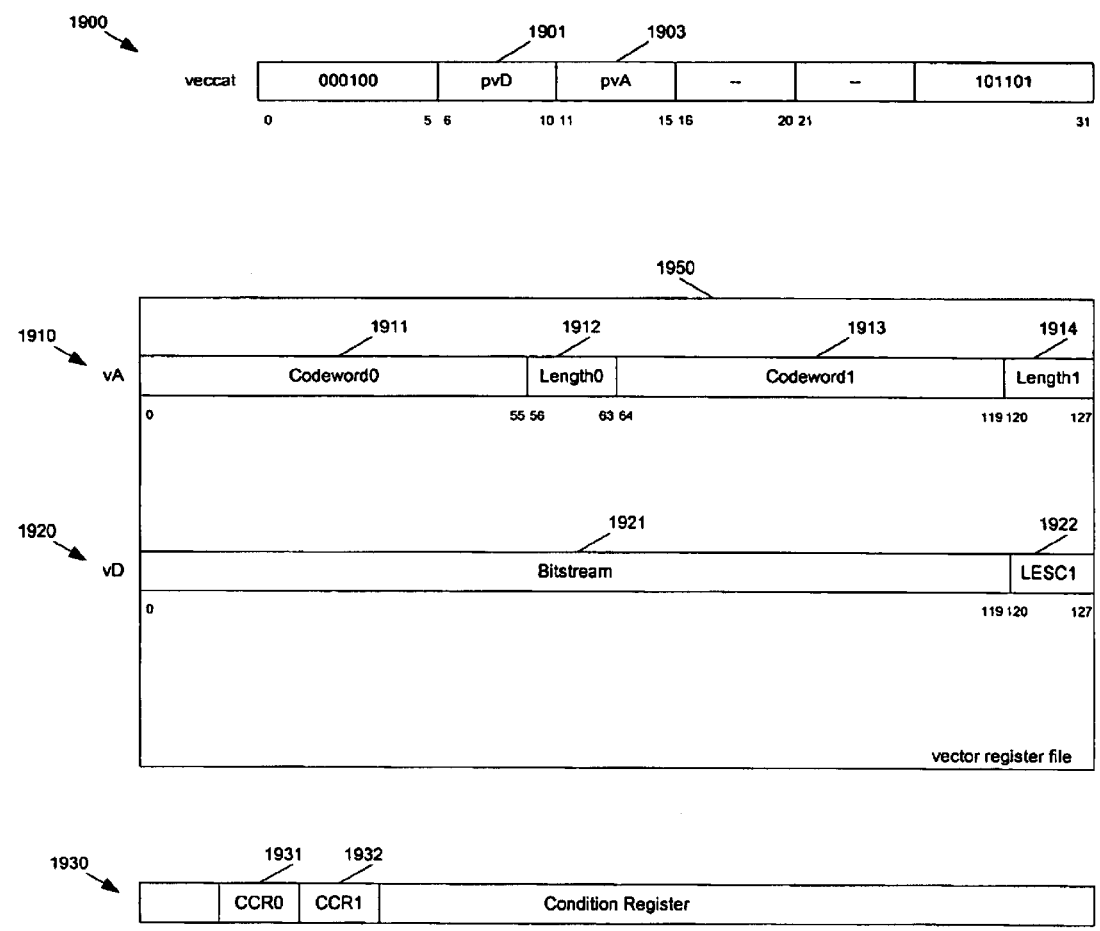
FIG. 19 illustrates data representations for the execution of an instruction to concatenate a plurality of variable length codewords according to one embodiment of the present invention.

FIG. 19 illustrates data representations for the execution of an instruction to concatenate a plurality of variable length codewords according to one embodiment of the present invention. Instruction veccat 1900 contains bit segments 1903 and 1901 for specifying the vector register (vA) that contains the input data and the vector register (vD) for storing the results. Vector register file 1950 contains entries 1910 and 1920 (vector registers vA and vD). Bit segments 1901 and 1903 specify respectively the locations of vector registers vD and vA in the vector register file. Vector register vA contains bit segments 1911 and 1913 for the codewords (Codeword0 1911 and Codeword1 1913) to be concatenated and bit segments 1912 and 1914 for specifying the bit lengths of the codewords (Length0 and Length1) respectively. Vector register vD contains bit segments 1921 for storing the bit stream resulting from concatenating the codewords (Codeword0 and Codeword1) and bit segment 1922 for storing the bit length of resulting bit stream. In condition register 1930, bits 1931 and 1932 are used to store the indicators, each which indicates whether or not the bit length of a corresponding input codeword is non-zero.

Since each codeword (e.g., Codeword0 1911 or Codeword1 1913) to be concatenated has a bit length smaller than 57, the bit length of the resulting bit stream (e.g., Bitstream 1921) is always smaller than 113, which can be entirely stored in bit segment 1921. No overflow will occur.

It is apparent from above description that the method and apparatus illustrated in FIGS. 18 and 19 cannot only be used to concatenate codewords from variable length encoding, but also be used to concatenate bit streams of variable lengths into a single fragment of bit stream. Thus, it is understood that codewords include bit streams in general and variable length codewords generated from variable length encoding in particular.

Figure 20:
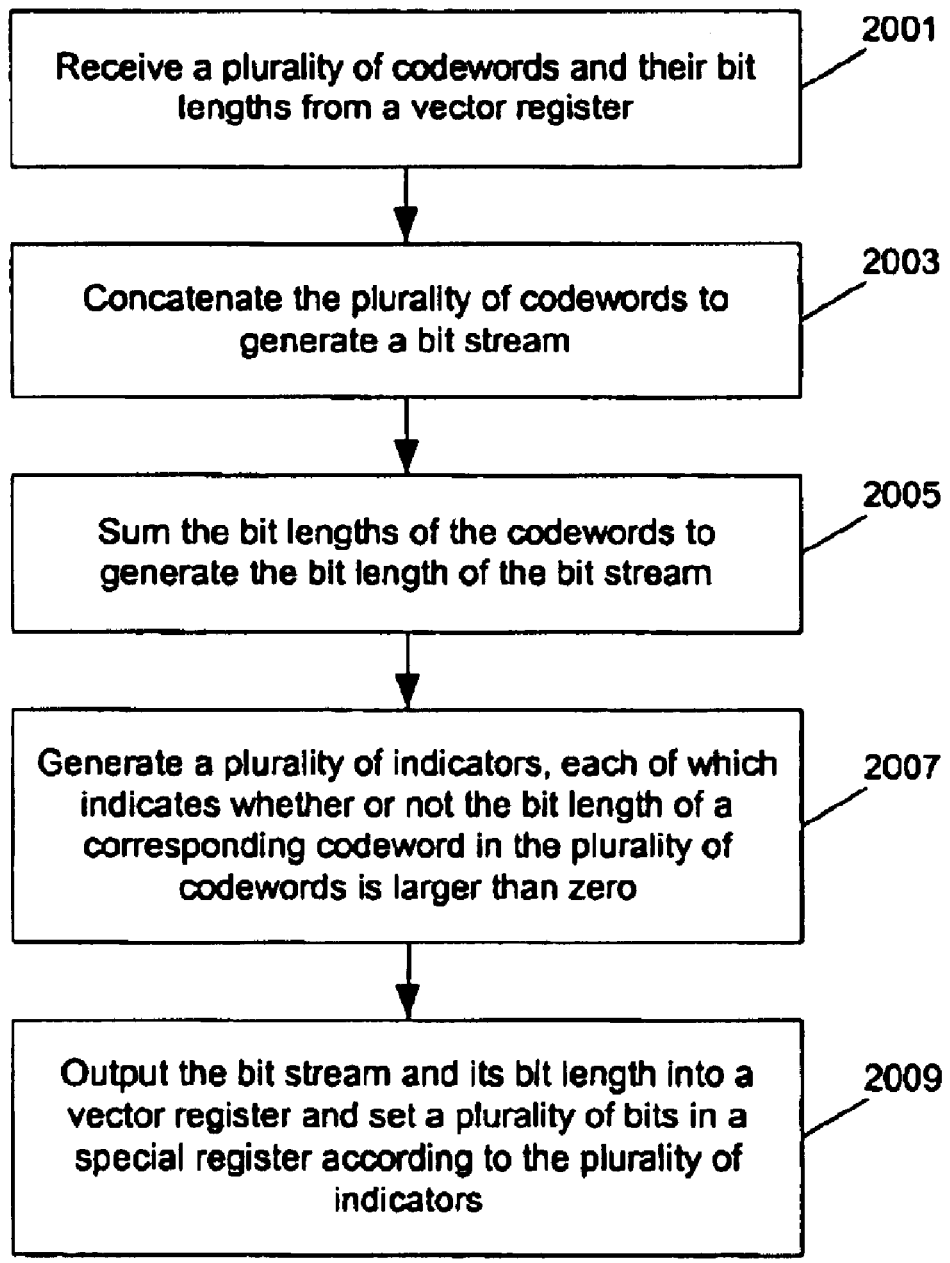
FIG. 20 shows a detailed flow diagram for a method to concatenate a plurality of variable length codewords according to one embodiment of the present invention.

FIG. 20 shows a detailed flow diagram for a method to concatenate a plurality of variable length codewords according to one embodiment of the present invention. Operation 2001 receives a plurality of codewords and their bit lengths from a vector register. Operation 2003 concatenates the plurality of codewords to generate a bit stream; Operation 2005 sums the bit lengths of the codewords to generate the bit length of the bit stream; and operation 2007 generates a plurality of indicators, each of which indicates whether or not the bit length of a corresponding one of the plurality of codewords is larger than zero. Note that operation 2003, 2005 and 2007 can be performed in a different order other than that shown in FIG. 20. In one embodiment of the present invention, operations 2003, 2005 and 2007 are performed concurrently. Operation 2009 outputs the bit stream and its bit length into a vector register and sets a plurality of bits in a special register according to the plurality of indicators.

Figure 21:
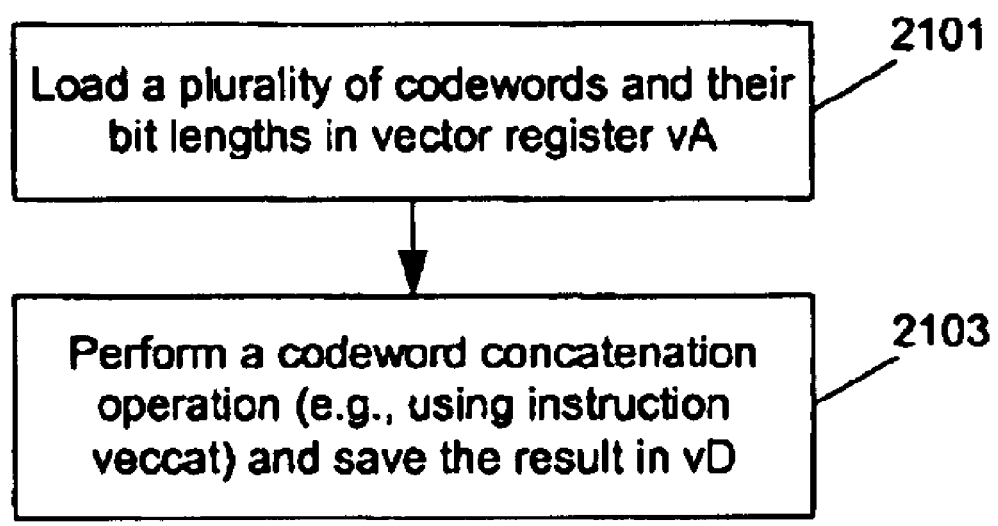
FIG. 21 shows a flow diagram for a method to concatenate a plurality of variable length codewords according to one embodiment of the present invention.

FIG. 21 shows a flow diagram for a method to concatenate a plurality of variable length codewords according to one embodiment of the present invention. Operation 2101 loads a plurality of codewords and their bit lengths in vector register vA; and operation 2103 performs a codeword concatenation operation (e.g., using instruction veccat) and saves the result in vector register vD. According to one embodiment of the present invention, the variable length codewords generated using instruction vecvlc in FIG. 13 are stored in the vector register (vD 1340 in FIG. 13) in a format that is the same as that for the input vector (vA 1910 in FIG. 19). Thus, a plurality of codewords generated in a vector register by using an instruction for variable length encoding can be used directly for concatenation without further manipulation.

Thus, the present invention provides methods and apparatuses for efficiently concatenating codewords of variable lengths into a single bit stream, which can be used to concatenating vectors of variable length codewords generated using various methods according to the present invention for packing variable length codewords into a bit strean.

At least one embodiment of the present invention seeks to efficiently pack bit streams of variable lengths into a continuous stream of bits such that a plurality of bit streams of variable lengths can be concatenated into a single bit stream.

To concatenate a plurality of bit streams into a single stream of bits, a vector register is used to collect the bits from these bit streams. When the space in the vector register for collecting bits of data is completely filled, the resulting bit segment in the space for collecting bits is stored into memory. The size of space for collecting bits is such that when stored into memory the resulting bit segment is properly aligned in memory (e.g., aligned to a byte boundary, to a halfword boundary, or to a word boundary). Therefore, after repeatedly filling the space with bits from the bit streams to be packed and consecutively storing the resulting bit segments in the space into memory, these bit streams can be packed into a single stream of bits.

Figure 22:
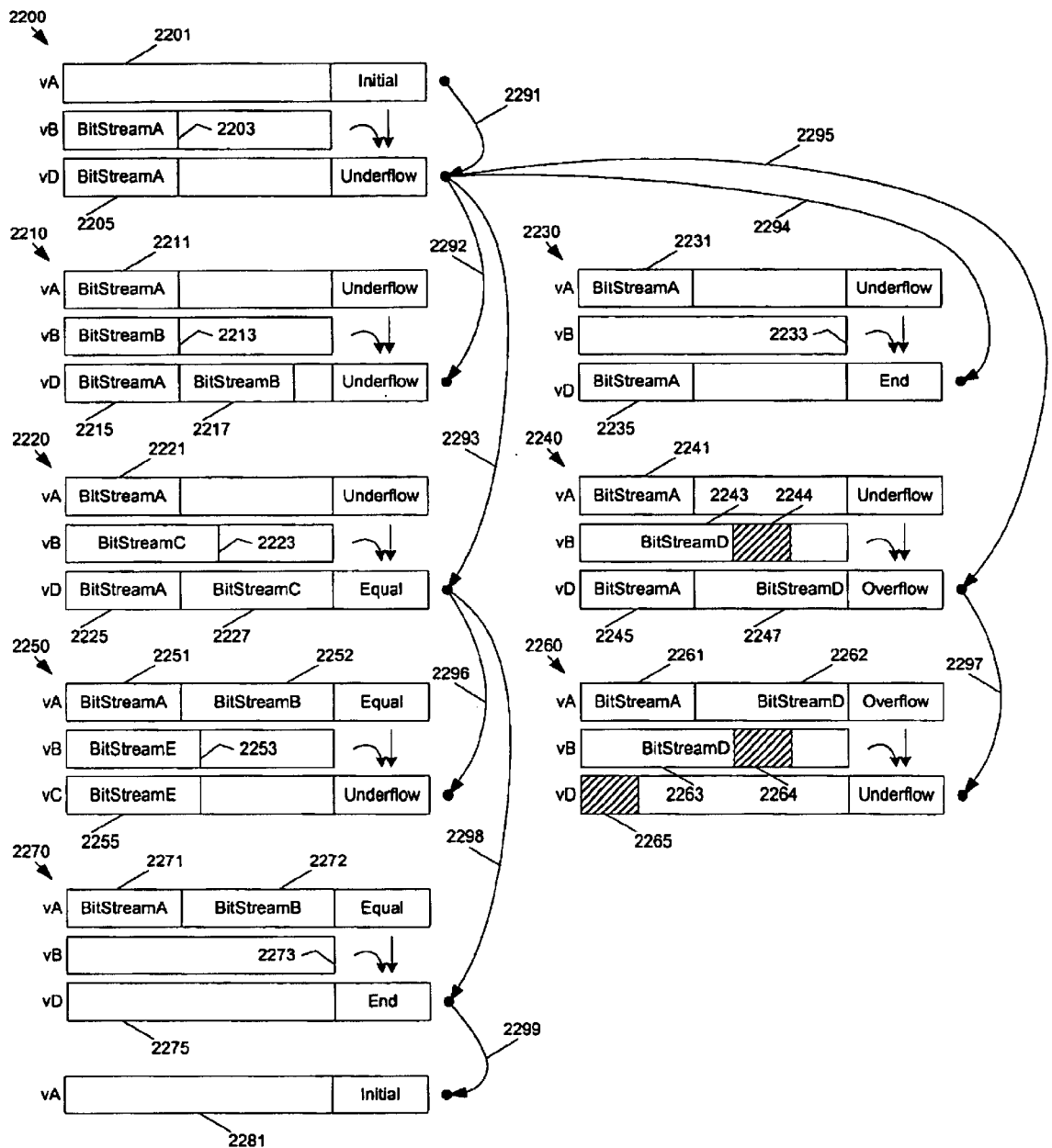
FIG. 22 illustrates various scenarios of packing bit streams according to one embodiment of the present invention.

FIG. 22 illustrates various scenarios of packing bit streams according to one embodiment of the present invention. In scenario 2200, bit stream 2203 in vector vB is packed into vector vA in an initial condition. Bit stream 2203 is copied as bit segment 2205 in the resulting vector vD. Since the bit stream 2203 does not fill up the space provided for the resulting bit stream, resulting vector vD is in an underflow condition, which indicates that more bits of data can be packed into vector vD.

In scenario 2210, bit stream 2213 in vector vB is packed into vector vA which is in an underflow condition. Since the sum of the bit lengths of the bit streams 2211 and 2213 is smaller than the space provided in the resulting vector vD, the bit stream resulting from concatenating bit stream 2211 and 2213 are stored in the resulting vector vD (2215 and 2217), which is in an underflow condition.

In scenario 2220, bit stream 2223 in vector vB is packed into vector vA which is in an underflow condition. Since the sum of the bit lengths of the bit streams 2221 and 2223 is equal to the space provided in the resulting vector vD, the bit stream resulting from concatenating bit stream 2221 and 2223 are stored in the resulting vector vD (2225 and 2227), which is in an equal condition. When a vector is in an equal condition, no more bits of data can be packed into the vector; and the fully packed bit segment can be stored away into memory.

In scenario 2230, empty bit stream 2233 in vector vB is packed into vector vA which is in an underflow condition. Since the empty bit stream (a bit stream of a zero bit length) is used to indicate the end of a string of bit streams to be packed, bits of zeros are appended to bit stream 2231 to fill up the space in the resulting vector vD (2235), which is in an end condition, so that the packed bit segment can be stored away. When a vector is in an end condition, the process for packing a new string of bit streams can be started.

In scenario 2240, a bit stream (2243 and 2244) in vector vB is packed into vector vA which is in an underflow condition. Since the sum of the bit lengths of the bit stream in vB and the bit stream 2241 is larger than the space provided in the resulting vector vD, only a portion of the bit stream in vB can be packed into the resulting vector vD. Thus, the bit stream resulting from concatenating bit stream 2241 and 2243 are stored in the resulting vector vD (2245 and 2247), which is in an overflow condition. When a vector is in an overflow condition, no more bits of data can be packed into the vector; and remaining bits 2244 in vB, which can not be fitted in the resulting vector, must be packed in the next packing operation. Since the resulting vector vD is fully packed, the fully packed bit segment can be stored away into memory.

In scenario 2260, a bit stream (2263 and 2264) in vector vB is packed into vector vA which is in an overflow condition. Since bit segment 2263 is packed in a previous operation, it is necessary to pack only bit segment 2264. Since the bit streams 2261 and 2262 have been stored away, they are ignored. Thus, the resulting bit stream 2265 contains only a copy of bit segment 2264. The resulting vector is in an underflow condition.

In scenario 2250, bit stream 2253 in vector vB is packed into vector vA which is in an equal condition. Since the bit streams 2251 and 2252 have been stored away, they are ignored. Thus, the resulting bit stream 2255 contains only a copy of bit segment 2253. The resulting vector is in an underflow condition.

In scenario 2270, empty bit stream 2273 in vector vB is packed into vector vA which is in an equal condition. Since the bit streams 2271 and 2272 have been stored away, they are ignored. Thus, the resulting bit stream 2275 contains no valid bits; and the resulting vector is in an end condition.

Thus, in packing a string of bit streams, a vector (e.g., VA or vD) may change from an initial condition to an underflow condition (2291), from an underflow condition to an underflow condition (2292), or to an equal condition (2293), or to an end condition (2294), or to an overflow condition (2295), from an overflow condition to an underflow condition (2297), from an equal condition to an underflow condition (2296), or to an end condition (2298), or from an end condition to an initial condition (2298).

Figure 23:
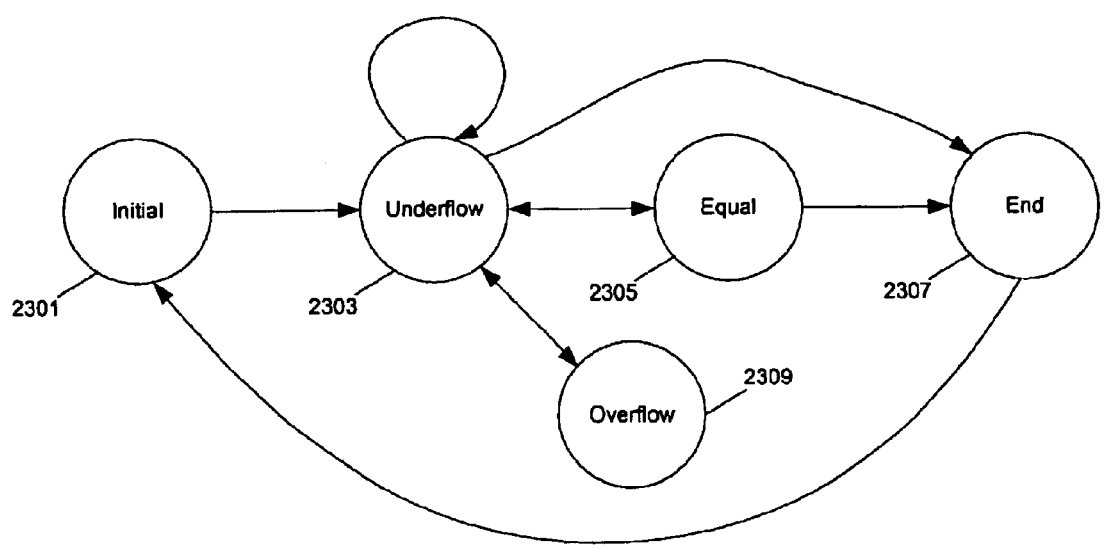
FIG. 23 shows a state diagram of packing bit streams according to one embodiment of the present invention.

FIG. 23 shows a state diagram of packing bit streams according to one embodiment of the present invention. In one embodiment of the present invention, the bit length of an input bit stream to be packed (e.g., bit stream 2203 in FIG. 22) is always smaller than the space available for packing in a vector in an initial condition. Thus, a packing operation can change a vector from initial state 2301 only to underflow state 2303 (assuming that no empty stream is used as the first bit stream to be packed). Depending on the bit length of the input bit stream and the bit length of the bit stream already packed in a vector that is in an underflow condition, a packing operation changes the vector from underflow state 2303 to overflow state 2309, or to equal state 2305, or to end state 2307 (when the input bit stream is an empty stream), or to underflow state 2303. A packing operation can change a vector from overflow state 2309 only to underflow state 2303, since the bit length of the remaining bit stream that is not packed in the previous operation is always smaller than the size of the space available for packing (see, for example, scenario 2260 in FIG. 22). Equal state 2305 can switch to either underflow state 2303 when the input bit stream is not an empty stream or end state 2307 when the input bit stream is an empty stream.

Alternative, when the bit length of an input bit stream to be packed can be larger than the space available for packing in a vector in an initial condition, more transition paths among various states are possible, which are not illustrated in FIG. 23. For example, initial state 2301 may switch to overflow state 2309 or equal state 2305; overflow state 2309 may switch to equal state 2305 or overflow state 2309; and equal state 2305 may switch to overflow state 2309 or equal state 2305.

Various parameters about the current state of the packing operations can be stored in the vector for packing to facilitate the state switching (e.g., along the paths illustrated in FIG. 23).

Figure 24:
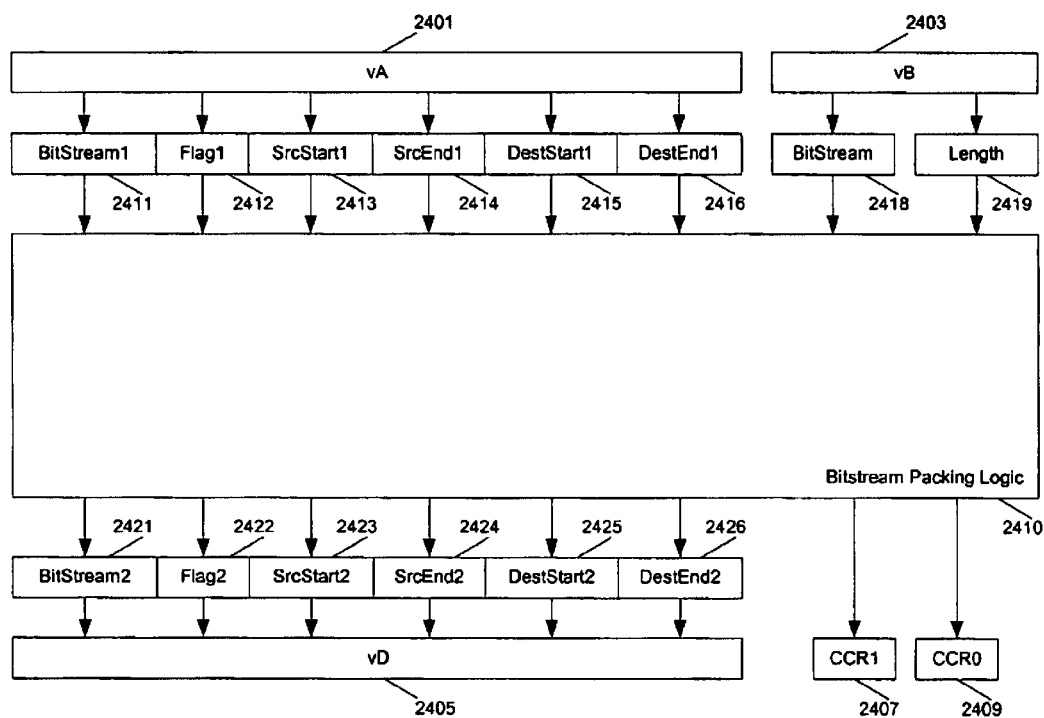
FIG. 24 shows a block diagram representation of a circuit for the execution of a method to pack bit streams according to one embodiment of the present invention.

FIG. 24 shows a block diagram representation of a circuit for the execution of a method to pack bit streams according to one embodiment of the present invention. Vector register vB (2403) contains bit segments for specifying an input bit stream 2418 (BitStream) and it bit length 2419 (Length). Vector register vA (2401) contains bit segments for a bit stream 2411 (BitStream1) that has been packed in a previous packing operation and flags 2412 (Flag1) that indicate the state of the previous packing operation. Vector register vA (2401) also contains bit segments for storing parameters 2413–2416 (SrcStart1, SrcEnd1, DestStart1, DestEnd1) from the previous packing operation that can be used to compute the parameters required to perform the current packing operation (e.g., the available space and location for packing the bits from BitStream (2418), and others). More details about these parameters are described further below. Bit stream packing logic 2410 appends the bits from BitStream (2418) after BitStream1 (2411) within the available space for packing to generate BitStream2 (2421). Flags 2422 (Flag2) are set to indicate the state of the current packing operation; and updated parameters 2423–2426 (SrcStart2, SrcEnd2, DestStart2, DestEnd2) are generated from the current packing operation. In one embodiment of the present invention, bits in a condition register (CCR0 and CCR1) are set to indicate whether or not all bits in BitStream (2418) are packed into BitStream2 (2421) and whether or not BitStream2 (2421) is fully packed (reached required bit length).

In one embodiment of the present invention, parameters SrcStart2 (2423) and SrcEnd2 (2424) are used to indicate in BitStream (2418) the locations of the starting and ending bits of the bit segment of BitStream (2418) that is packed into BitStream2 (2421); and parameters DestStart2 (2425) and DestEnd2 (2426) are used to indicate in BitStream2 (2421) the locations of the starting and ending bits of the bit segment of BitStream that is packed into BitStream2 (2421). Similarly, SrcStart1 (2413) and SrcEnd1 (2414) are used to indicate in the input stream the position of the input bit segment that is packed into BitStream1 (2411) in the previous packing operation; and DestStart1 (2415) and DestEnd1 (2416) are used to indicate in the BitStream1 (2411) the position of the packed input bit segment in the previous packing operation. More details about such an embodiment are described below with the description of FIG. 25.

In an alternative embodiment of the present invention, parameters SrcStart1 (2413) and SrcEnd1 (2414) are used to indicate in BitStream (2418) the locations of the starting and ending bits of the input bit segment of BitStream (2418) to be packed by bit stream packing logic 2410 in the current packing operation; and parameters DestStart1 (2415) and DestEnd1 (2416) are used to indicate the locations of the starting and ending bits of the bit segment in a resulting bit stream that may be used to pack the bits from BitStream by bit steam packing logic 2410 in the current packing operation. Similarly, SrcStart2 (2423), SrcEnd2 (2424), DestStart2 (2425), DestEnd2 (2426) are updated by bit stream packing logic 2410 to indicate the remaining bits in BitStream (2418) that needs to be packed in the next packing operation, if any, and the available space in vD (2405) for the next packing operation. More details about such an embodiment are described below with the description of FIG. 26.

Figure 25:
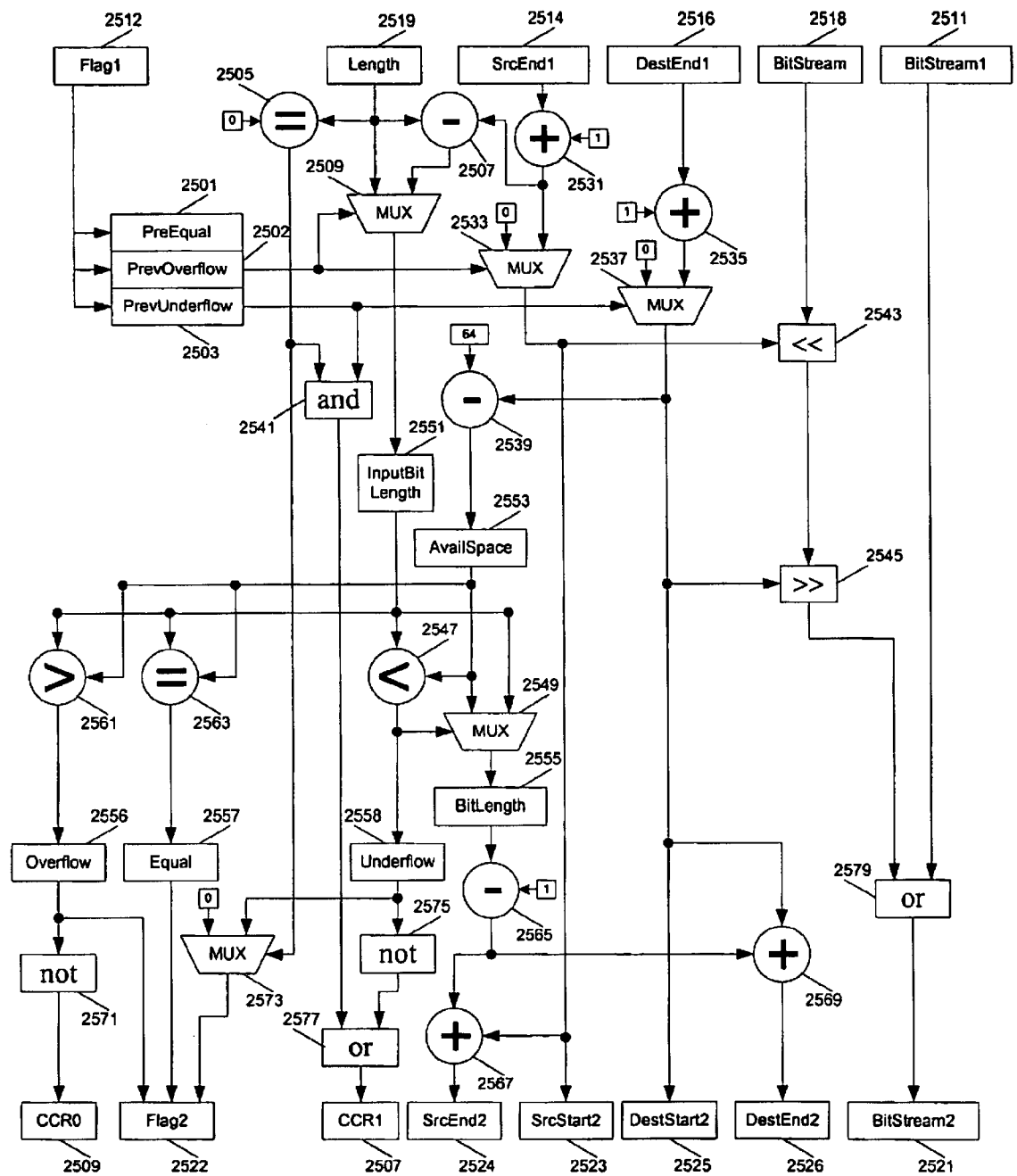
FIG. 25 shows a detail block diagram representation of bit stream packing logic according to one embodiment of the present invention.

FIG. 25 shows a detail block diagram representation of bit stream packing logic according to one embodiment of the present invention. In one embodiment of the present invention, Flag1 (2512) contains bits PreEqual (2501), PreOverflow (2502) and PreUnderflow (2503). PreOverflow is one when the previous packing operation is in the state of overflow and zero when otherwise. PreUnderflow is one when the previous packing operation is in the state of underflow and zero when otherwise. PreEqual is one when the previous packing operation is in the state of equal. DestEnd1 (2516) is the index for the last bit in BitStream1; and adder 2536 increases DestEnd1 by one to compute a candidate for DestStart2 (2525), which is the index of the first bit in BitStream2 for packing the bits from BitStream. When the previous operation is in an underflow condition, BitStream1 has at least one bit of data; and multiplexer 2537 selects the result from adder 2535. When the previous operation is not in an underflow condition, multiplexer 2537 selects zero so that the bits from BitStream is packed from the beginning of BitStream2.

SrcEnd1 (2514) is the index for the last bit of the bit segments from BitStream that is packed into BitStream1 in the previous packing operation. Adder 2531 increases SrcEnd1 by one to compute a candidate for SrcStart2 (2523), which is the index of the first bit in BitStream to be packed into BitStream2. When the previous operation is in an overflow condition, BitStream contains remaining bits to be packed into BitStream2; and multiplexer 2533 selects the result from adder 2531. When the previous operation is not in an overflow condition, multiplexer 2533 selects zero so that the first bit to be packed is the first bit of BitStream.

Length (2519) is the total bit length of BitStream (2518). When the previous operation is not in an overflow condition, all the bits in BitStream 2518 must be packed; and multiplexer 2509 selects Length 2519 as InputBitLength, which is the total number of bits to be packed from the input bit stream 2518. When the previous operation is in an overflow condition, only the remaining bits in BitStream need to be packed; and multiplexer 2509 selects the result from substractor 2507, which reduces Length (2519) by the number of bits packed in the previous operation (the result from adder 2531). In one embodiment of the present invention, the space for storing packed bit stream is 64 bits. Substractor 2539 produces the bit length of the available space for packing in the resulting bit stream the bits from BitStream. Multiplexer 2549 and tester 2547 select the smaller one of InputBitLength (2551) and AvailSpace (2553) as BitLength (2555), which is the number of bits to be packed into BitStream2 in the current packing operation. Since BitLength 2555 is computed from comparing the available space for packing and the total input bits for packing, various state transition paths can be processed, including the paths not shown in FIG. 23 (e.g., from overflow to equal, or from equal to equal, or from initial to overflow). Adders 2567 and 2569 computes SrcEnd2 (2567) and DestEnd2 (2569), the indices of the ending bits in BitStream and BitStream2 respectively for the bit segment packed in the current packing operation.

When Length (2519) is not zero (i.e., the input bit stream is not an empty one), multiplexer 2573 selects the result of tester 2547 as the flag for the underflow flag in Flag2 (2522). When the input bit stream is an empty one, the underflow flag in Flag2 (2522) is set to zero by multiplexer 2573. Thus, when all the three flags are set to zero, it is an indication that an empty bit stream is detected (the bit length of the input bit stream is zero); and the current packing operation is in an end condition; otherwise, one of the three flags is set to one, indicating the packing operation is in a state of overflow, or equal, or underflow.

Logic units 2575, 2577 and 2541 produce CCR1 (2507), which indicate whether or not the BitStream2 fully packed. When the previous operation is in an underflow condition and the current input bit stream is an empty one, CCR1 is set to one in order to flush out the bits in BitStream1 (or BitStream2); otherwise, the resulting bit stream is fully packed only if InputBitLength (2551) is not smaller than AvailSpace (2553).

Testers 2561 and 2563 produce the results for the overflow and equal flags in Flag2 for the current packing operation to indicate whether or not the current operation is in an overflow condition and whether or not the current operation is in an equal condition. Logic unit 2571 sets CCR0 (2509) to zero only when an overflow condition occurs.

Shifters 2543 and 2545 and logic OR unit 2579 shift BitStream (2518) and appends BitStream (2518) to Bit-Stream1 (2511) to produce the resulting bit stream (BitStream2 2521).

Figure 26:
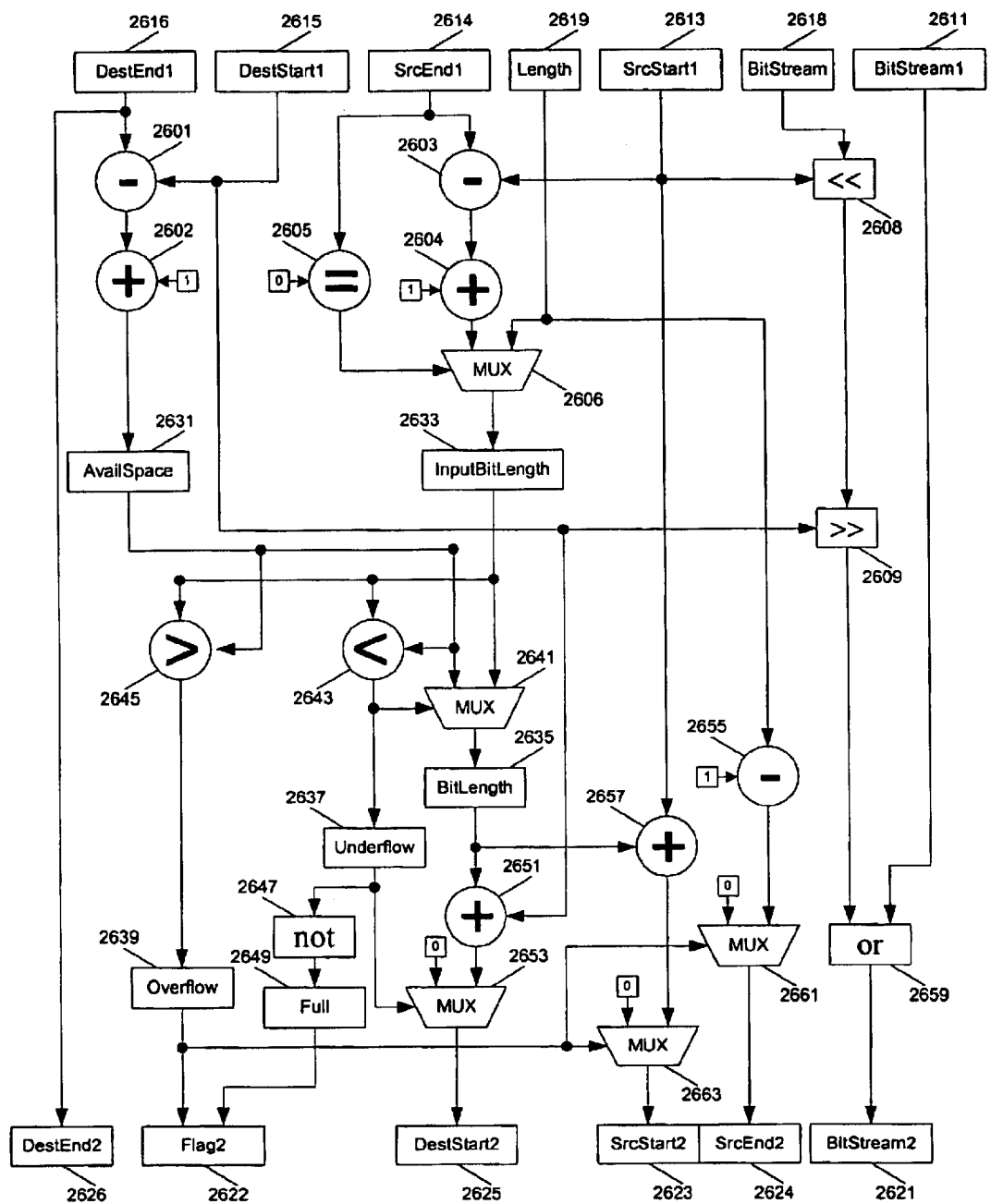
FIG. 26 shows a detail block diagram representation of bit stream packing logic according to another embodiment of the present invention.

FIG. 26 shows a detail block diagram representation of bit stream packing logic according to another embodiment of the present invention. In this embodiment of the present invention, DestStart1 (2615) and DestEnd1 (2616) represent the indices of the beginning and ending bits of the available space for the current packing operation; and SrcStart1 (2613) and SrcEnd1 (2614) are the indices of the beginning and ending bits in the bit stream to be packed (BitStream), when SrcEnd1 is not zero. Thus, adder 2602 and substractor 2601 compute the available space 2631 (AvailSpace) from DestEnd1 (2616) and DestStart1 (2615). When tester 2605 determines that SrcEnd1 is zero, multiplexer 2606 selects Length (2619) as InputBitLength (2633), which is the total number of bits to be packed from the input bit stream 2618; otherwise, adder 2604 and substractor 2603 computes InputBitLength (2633) from SrcEnd1 (2614) and SrcStart1 (2613).

Multiplexer 2641 and tester 2643 select the smaller one from AvailSpace (2631) and InputBitLength (2633) as BitLength (2635), which is the number of bits to be packed in the current packing operation. Tester 2643 produces Underflow 2637, which indicates whether or not InputBitLength (2633) is smaller than AvailSpace (2631). When Underflow (2637) is one, multiplexer 2653 selects the sum of DestStart1 (2615) and BitLength (2635) as DestStart2 (2625) to indicate that the start point for packing the next bit stream is after the last bit packed in this operation; otherwise, multiplexer 2653 selects zero as DestStart2. DestEnd1 is saved as DestEnd2 without any modification.

Tester 2645 produces Overflow 2639, which indicates whether or not the current packing operation is in an overflow condition. Logic unit 2647 inverses 2637 to generate Full (2649), which indicates whether or not the resulting bit stream (BitStream2 2621) is fully packed. Overflow 2639 and Full 2649 set the corresponding bits in Flag2 (2622).

When the current packing operation is in an overflow condition (Overflow 2639 is one), adder 2657 and substractor 2655 compute SrcStart2 (2623) and SrcEnd2 (2661), the indices of the first and last bits of the remaining bits in BitStream to be packed in the next packing operation; otherwise, zeros are selected by multiplexer 2663 and 2661 as SrcStart2 (2623) and SrcEnd2 (2661) to indicate that the first and last bits of the next input stream must be determined from the bit length of the next input stream.

Shifters 2608 and 2609 and logic OR unit 2659 shift BitStream (2618) and append BitStream (2618) to Bit-Stream1 (2611) to produce the resulting bit stream (BitStream2 2621).

Figure 27:
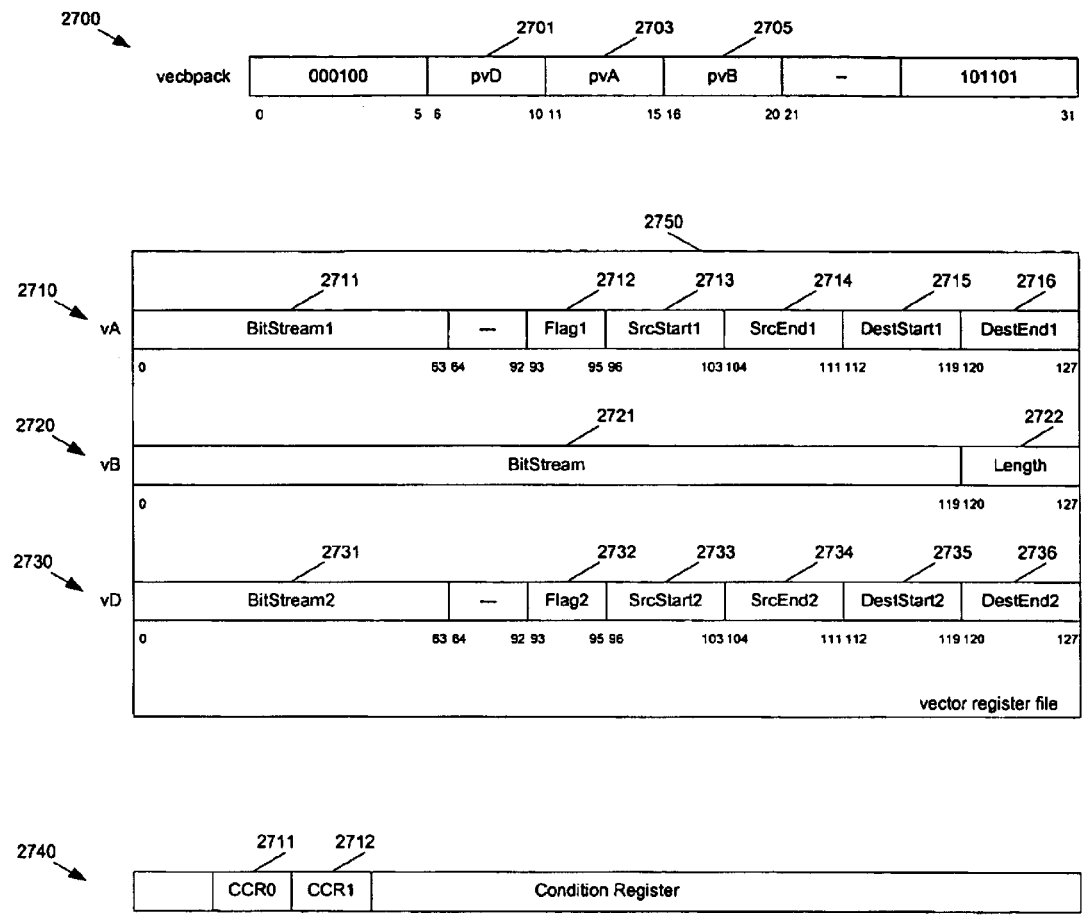
FIG. 27 illustrates data representations for the execution of an instruction to pack bit streams according to one embodiment of the present invention.

FIG. 27 illustrates data representations for the execution of an instruction to pack bit streams according to one embodiment of the present invention. Instruction vecbpack 2700 contains bit segments 2701–2705 for specifying the vector registers (vA and vB) that contain the input data and the vector register (vD) for storing the results. Vector register file 2750 contains entries 2710, 2720 and 2730 (vector registers vA, vB and vD). Bit segments 2701, 2703 and 2705 specify respectively the locations of vector registers vD, vA and vB in the vector register file. Vector register vA contains bit segment 2711 for storing the bit stream packed in the previous packing operation (BitStream1), bit segment 2712 for storing the flags (Flag1), which indicate the state of the previous packing operation, and bit segments 2713–2716 for storing SrcStart1, SrcEnd1, DestStart1, and DestEnd1 respectively. Vector register vB contains bit segment 2721 for storing the input bit stream to be packed (BitStream 2721) and bit segment 2722 for storing the bit length of the input bit stream (Length 2722). After the execution of instruction vecbpack, vector register vD contains bit segment 2731 for storing the bit stream resulting from the current packing operation (BitStream2), bit segment 2732 for storing the flags (Flag2), which indicate the state of the current packing operation, and bit segments 2723–2726 for storing updated parameters SrcStart2, SrcEnd2, DestStart2, and DestEnd2 respectively. In one embodiment of the present invention, bits 2711 and 2712 (CCR0 and CCR1) in a condition register (2740) are used to report whether or not all bits in BitStream (2721) are packed into bit segment 2731 and whether or not bit segment 2731 is fully packed.

Figure 28:
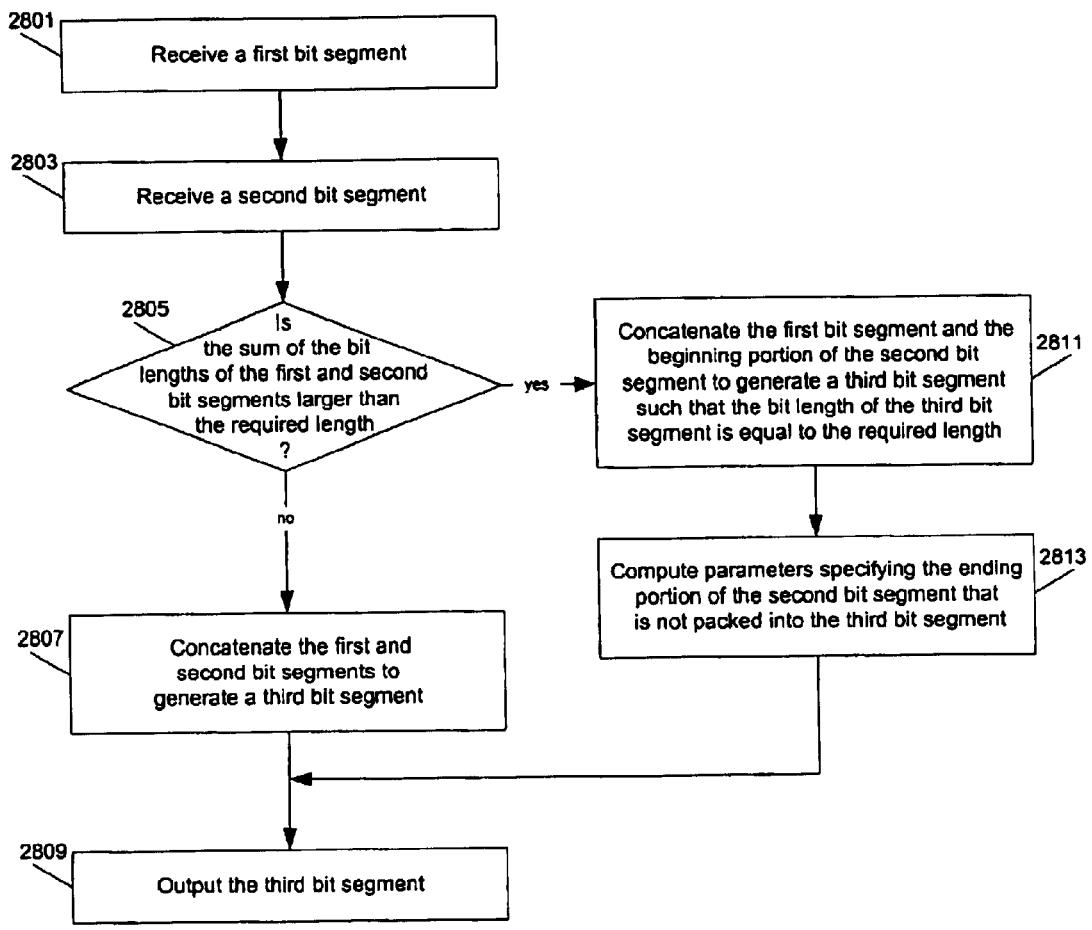
FIG. 28 shows a flow diagram for a method to pack bit streams according to one embodiment of the present invention.

FIG. 28 shows a flow diagram for a method to pack bit streams according to one embodiment of the present invention. Operation 2801 receives a first bit segment from a vector register. Operation 2803 receives a second bit segment to be packed with the first bit segment. When operation 2805 determines that the sum of the bit lengths of the first and second bit segments is larger than the required length, operation 2811 concatenates the first bit segment and the beginning portion of the second bit segment to generate a third bit segment such that the bit length of the third bit segment is equal to the required length; and operation 2813 computes the parameters to specify the ending portion of the second bit segment that is not packed into the third bit segment and that must be packed in the next packing operation. When the operation 2805 determines that the sum of the bit lengths of the first and second bit segments is not larger than the required length, operation 2807 concatenates the first and second bit segments to generate a third bit segment. The third bit segment is output into a vector register in operation 2809.

Figure 29:
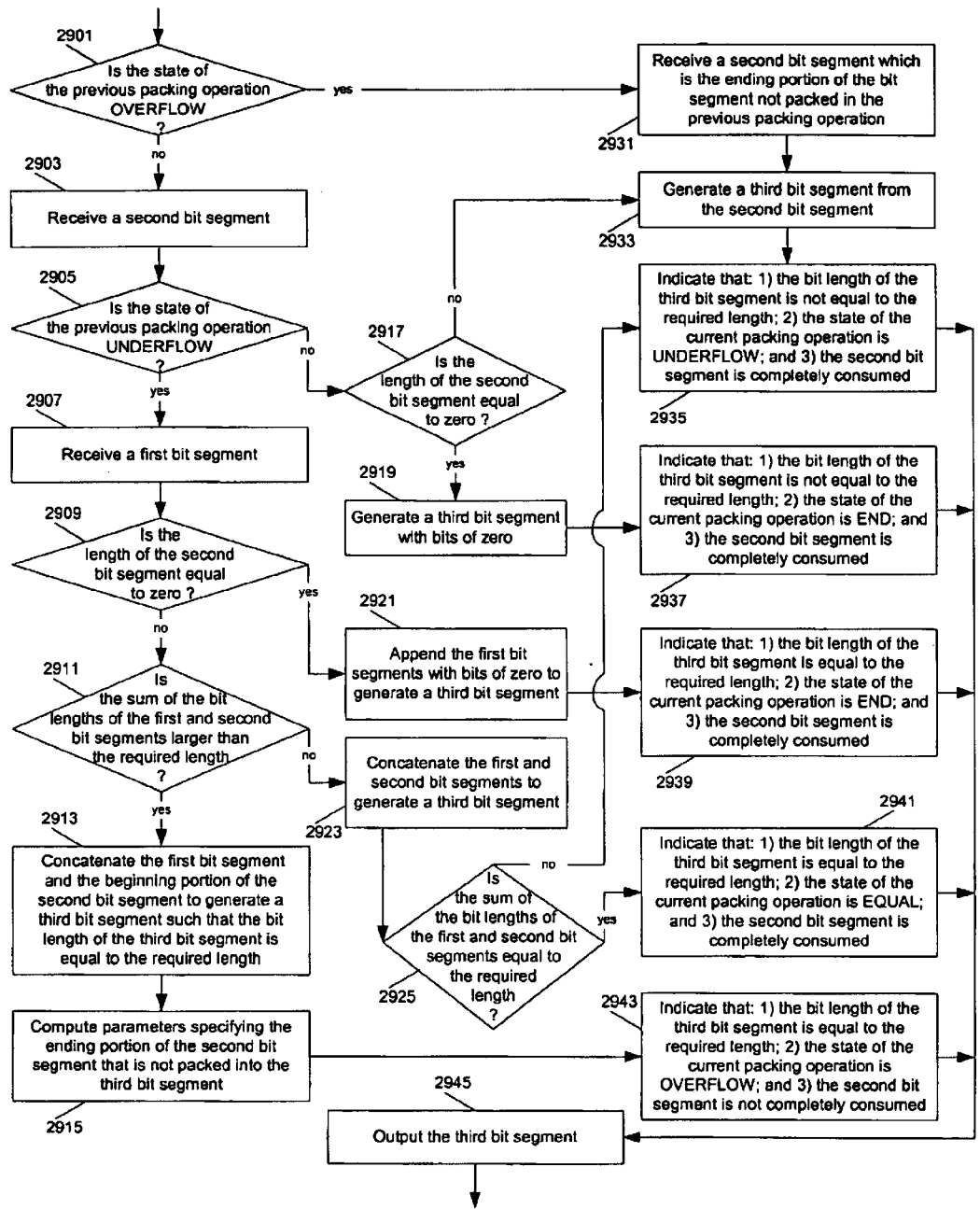
FIG. 29 shows a detailed flow diagram for a method to pack bit streams according to one embodiment of the present invention.

FIG. 29 shows a detailed flow diagram for a method to pack bit streams according to one embodiment of the present invention. When operation 2901 determines that the state of the previous packing operation is overflow, operation 2931 receives a second bit segment which is the ending portion of the bit segment not packed in the previous packing operation. Operation 2933 generates a third bit segment from the second bit segment. Operation 2935 indicates that: i) the bit length of the third bit segment is not equal to the required length (partially packed and not ready to be saved as a fully packed bit segment); ii) the state of the current operation is underflow (there are valid bits of data in the resulting bit stream to be packed with the next input bit stream); and iii) the second bit segment is completely consumed (completely packed into the third bit segment).

When operation 2901 determines that the state of the previous packing operation is not overflow, operation 2903 receives a second bit segment to be packed. When operation 2905 determines that the previous packing operation is not underflow and operation 2917 determines that the length of the second bit segment is not zero, no valid bits of data are available to pack with the second bit segment; and operations 2933 and 2935 generates a third bit segments for the second bit segment. When operation 2905 determines that the previous packing operation is not underflow and operation 2917 determines that the length of the second bit segment is zero, no valid bits of data need to be packed; operation 2919 generates a third bit segment with bits of zero; and operation 2937 indicates that: i) the bit length of the third bit segment is not equal to the required length; ii) the state of the current operation is end (an empty input bit stream is encountered); and iii) the second bit segment is completely consumed (new input bit stream is required).

When operation 2905 determines that the previous packing operation is underflow, operation 2907 receives a first bit segment, with which the second bit segment is to be packed together. If operation 2909 determines that the second bit segment is an empty stream, operation 2921 appends the first bit segments with bits of zero to generate a third bit segment such that the third bit segment has a bit length equal to the require length; and operation 2939 indicates that: i) the bit length of the third bit segment is equal to the required length (ready as a fully packed bit stream); ii) the state of the current operation is end; and iii) the second bit segment is completely consumed.

When the second bit segment is not an empty stream, operation 2923 concatenates the first and second bit streams to generate a third bit segment, if operation 2911 determines that the sum of the bit lengths of the first and second bit segments is not larger than the required length. If operation 2925 determines that the sum of the bit lengths of the first and second bit segments is equal to the required length, operation 2941 indicates that: i) the bit length of the third bit segment is equal to the required length (ready to be saved as a fully packed bit segment); ii) the state of the current operation is equal; and iii) the second bit segment is completely consumed. Otherwise, operation 2935 is performed.

If operation 2911 determines that the sum of the bit lengths of the first and second bit segments is larger than the required length, operation 2913 concatenates the first bit segment and the beginning portion of the second bit segment to generate a third bit segment such that the bit length of the third bit segment is equal to the required length; operation 2915 computes the parameters to specify the ending portion of the second bit segment that is not packed into the third bit segment and that needs be packed in the next packing operation; and operation 2943 indicates that: i) the bit length of the third bit segment is equal to the required length (ready to be saved as a fully packed bit segment); ii) the state of the current operation is overflow (there are remaining bits in the second bit segment to be packed in the next packing operation); and iii) the second bit segment is not completely consumed.

Finally, operation 2945 outputs the third bit segment to a vector register (or memory).

Figure 30:
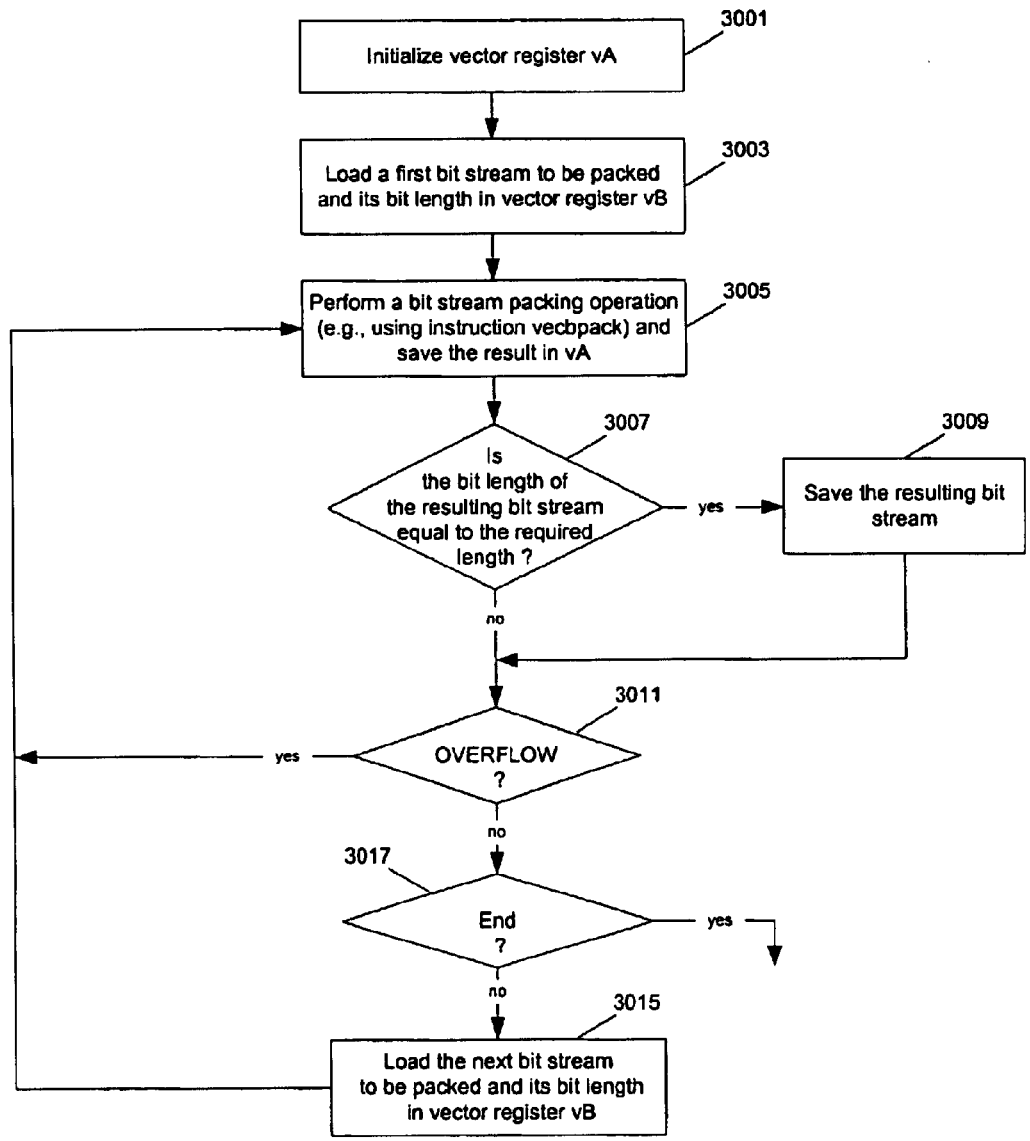
FIG. 30 shows a flow diagram for a method to pack bit streams according to one embodiment of the present invention.

FIG. 30 shows a flow diagram for a method to pack bit streams according to one embodiment of the present invention. Operation 3001 initializes vector register vA to represent a vector in an initial condition. Operation 3003 loads a first bit stream to be packed and its bit length in vector register vB. Operation 3005 performs a bit stream packing operation (e.g., using instruction vecbpack) and saves the result in vector register vA. If operation 3007 determines that the bit length of the resulting bit stream in vA is equal to the required length, operation 3009 saves the resulting bit stream from vA to memory. If operation 3011 determines that the previous packing operation (3005) is in a state of overflow, the data in vector vB is reused as input without any modification to perform the next packing operation (3005); otherwise, operation 3017 determines whether or not an end condition is encountered (e.g., an empty input stream is detected in vector register vB). If no end condition is encountered, operation 3015 loads the next bit stream to be packed and its bit length in vector register vB; and operation 3005 is used to pack the next bit stream.

Thus, the present invention provides methods and apparatuses for efficiently packing bit streams of variable lengths into a single segment stream of bits, which can be used to concatenating variable length codewords generated using various methods according to the present invention into a single stream of bits.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for execution by a microprocessor, the method comprising:
   receiving a first list of a plurality of elements from a first vector register;
   generating a plurality of run values respectively for the first list of elements, at least one of the plurality of run values indicating a number of consecutive elements of a first value immediately preceding a corresponding element in the first list; and
   outputting the plurality of run values into a second vector register;
   wherein the above operations are performed in response to the microprocessor receiving a single instruction.

2. A method as in claim 1 further comprising:
   receiving a second element before generating the plurality of run values;
   wherein the second element indicates a number of consecutive elements of the first value immediately preceding a first element in a second list of elements;
   in the second list of elements the first element immediately precedes the first list of elements; and
   each of the plurality of run values indicates a number of consecutive elements of the first value in the second list immediately preceding a corresponding element in the second list.

3. A method as in claim 2 further comprising:
   receiving the first element before generating the plurality of run values.

4. A method as in claim 3 wherein the first and second elements are received from at least one vector register.

5. A method as in claim 2 wherein the first element is received from the first vector register.

6. A method as in claim 2 wherein the first and second vector registers are the same vector register.

7. A method as in claim 2 wherein the first value is zero.

8. A method as in claim 7 further comprising:
   computing a first index pointing to a last non-zero element in the second list from a second index indicating a number of elements in the second list and a run value of a last element of the second list.

9. A method as in claim 8 further comprising:
   processing elements of the second list to zero run length encode the second list of elements to generate first data until the last non-zero element indicated by the first index is zero run length encoded without going through elements located after the last non-zero element in the second list.

10. A method as in claim 9 further comprising:
    generating an image stream using the first data, the image stream being encoded in accordance with one of:
    a) an MPEG (Moving Picture Expert Group) standard;
    b) a JPEG (Joint Photographic Expert Group) standard;
    c) a DV (Digital Video) standard; and
    d) an ITU (International Telecommunication Union) standard.

11. A method as in claim 1, wherein each element of the first list of elements comprises more than one bit.

12. A method to perform zero run length encoding, the method comprising:
    computing a first run value of a last element of a list of elements; and
    computing a first index pointing to a last non-zero element in the list from a second index indicating a number of elements in the list and the first run value.

13. A method as in claim 12 further comprising:
    processing elements of the list to zero run length encode the list of elements to generate first data until the last non-zero element indicated by the first index is zero run length encoded without going through elements located after the last non-zero element in the list.

14. A method as in claim 12, wherein the last element has a value of zero.

15. A machine readable medium containing executable computer program instructions which when executed by a digital processing system cause said system to perform a method, the method comprising:
    receiving a first list of a plurality of elements from a first vector register;
    generating a plurality of run values respectively for the first list of elements, at least one of the plurality of run values indicating a number of consecutive elements of a first value immediately preceding a corresponding element in the first list; and
    outputting the plurality of run values into a second vector register;
    wherein the above operations are performed in response to the microprocessor receiving a single instruction.

16. A medium as in claim 15 wherein the method further comprises:
    receiving a second element before generating the plurality of run values;
    wherein the second element indicates a number of consecutive elements of the first value immediately preceding a first element in a second list of elements;
    in the second list of elements the first element immediately precedes the first list of elements; and
    each of the plurality of run values indicates a number of consecutive elements of the first value in the second list immediately preceding a corresponding element in the second list.

17. A medium as in claim 16 wherein the method further comprises:
    receiving the first element before generating the plurality of run values.

18. A medium as in claim 17 wherein the first and second elements are received from at least one vector register.

19. A medium as in claim 16 wherein the first element is received from the first vector register.

20. A medium as in claim 16 wherein the first and second vector registers are the same vector register.

21. A medium as in claim 16 wherein the first value is zero.

22. A medium as in claim 21 wherein the method further comprises:

computing a first index pointing to a last non-zero element in the second list from a second index indicating a number of elements in the second list and a run value of a last element of the second list.

23. A medium as in claim 22 wherein the method further comprises:

processing elements of the second list to zero run length encode the second list of elements to generate first data until the last non-zero element indicated by the first index is zero run length encoded without going through elements located after the last non-zero element in the second list.

24. A medium as in claim 23 wherein the method further comprises:

generating an image stream using the first data, the image stream being encoded in accordance with one of:
a) an MPEG (Moving Picture Expert Group) standard;
b) a JPEG (Joint Photographic Expert Group) standard;
c) a DV (Digital Video) standard; and
d) an ITU (International Telecommunication Union) standard.

25. A medium as in claim 15, wherein each element of the first list of elements comprises more than one bit.

26. A machine readable medium containing executable computer program instructions which when executed by a digital processing system cause said system to perform a method to perform zero run length encoding, the method comprising:

computing a first run value of a last element of a list of elements; and computing a first index pointing to a last non-zero element in the list from a second index indicating a number of elements in the list and the first run value.

27. A medium as in claim 26 wherein the method further comprises:

processing elements of the list to zero run length encode the list of elements to generate first data until the last non-zero element indicated by the first index is zero run length encoded without going through elements located after the last non-zero element in the list.

28. A method as in claim 26, wherein the last element has a value of zero.

29. A digital processing system to perform run length encoding, the system comprising:

means for receiving a first list of a plurality of elements from a first vector register;

means for generating a plurality of run values respectively for the first list of elements, at least one of the plurality of run values indicating a number of consecutive elements of a first value immediately preceding a corresponding element in the first list; and means for outputting the plurality of run values into a second vector register;

wherein the above means operate in response to a microprocessor in the system receiving a single instruction.

30. A digital processing system as in claim 29 further comprising:

means for receiving a second element before generating the plurality of run values;

wherein the second element indicates a number of consecutive elements of the first value immediately preceding a first element in a second list of elements;

in the second list of elements the first element immediately precedes the first list of elements; and each of the plurality of run values indicates a number of consecutive elements of the first value in the second list immediately preceding a corresponding element in the second list.

31. A digital processing system as in claim 30 further comprising:

means for receiving the first element before generating the plurality of run values.

32. A digital processing system as in claim 31 wherein the first and second elements are received from at least one vector register.

33. A digital processing system as in claim 30 wherein the first element is received from the first vector register.

34. A digital processing system as in claim 30 wherein the first and second vector registers are the same vector register.

35. A digital processing system as in claim 30 wherein the first value is zero.

36. A digital processing system as in claim 35 further comprising:

means for computing a first index pointing to a last non-zero element in the second list from a second index indicating a number of elements in the second list and a run value of a last element of the second list.

37. A digital processing system as in claim 36 further comprising:

means for processing elements of the second list to zero run length encode the second list of elements to generate first data until the last non-zero element indicated by the first index is zero run length encoded without going through elements located after the last non-zero element in the second list.

38. A digital processing system as in claim 37 further comprising:

means for generating an image stream using the first data, the image stream being encoded in accordance with one of:
a) an MPEG (Moving Picture Expert Group) standard;
b) a JPEG (Joint Photographic Expert Group) standard;
c) a DV (Digital Video) standard; and
d) an ITU (International Telecommunication Union) standard.

39. A digital processing system as in claim 29, wherein each element of the first list of elements comprises more than one bit.

40. A digital processing system to perform zero run length encoding, the system comprising:

means for computing a first run value of a last element of a list of elements; and means for computing a first index pointing to a last non-zero element in the list from a second index indicating a number of elements in the list and the first run value.

41. A digital processing system as in claim 40 further comprising:

means for processing elements of the list to zero run length encode the list of elements to generate first data until the last non-zero element indicated by the first index is zero run length encoded without going through elements located after the last non-zero element in the list.

42. A digital processing system as in claim 40, wherein the last element has a value of zero.

43. A digital processing system to perform run length encoding, the system comprising:

a vector register file having a first vector register and a second vector register; and a vector execution unit coupled to the vector register file, in response to receiving a single instruction, the vector execution unit:

receiving a first list of a plurality of elements from the first vector register, generating a plurality of run values respectively for the first list of elements, at least one of the plurality of run values indicating a number of consecutive elements of a first value immediately preceding a corresponding element in the first list, and outputting the plurality of run values into the second vector register.

44. A digital processing system as in claim 43 further comprising:

memory coupled to the vector register, the memory storing a second list of elements, in response to receiving a single instruction, the vector execution unit:

receiving a second element before generating the plurality of run values;

wherein the second element indicates a number of consecutive elements of the first value immediately preceding a first element in the second list;

in the second list of elements the first element immediately precedes the first list of elements; and each of the plurality of run values indicates a number of consecutive elements of the first value in the second list immediately preceding a corresponding element in the second list.

45. A digital processing system as in claim 44 wherein in response to receiving a single instruction the vector execution unit receives the first element before generating the plurality of run values.

46. A digital processing system as in claim 45 wherein the first and second elements are received from at least one vector register.

47. A digital processing system as in claim 44 wherein the first element is received from the first vector register.

48. A digital processing system as in claim 44 wherein the first value is zero.

49. A digital processing system as in claim 48 further comprising:

a scalar execution unit coupled with the memory, the memory storing a second index indicating a number of elements in the second list, the vector execution unit generating a first run value of a last element of the second list, the scalar execution unit computing a first index pointing to a last non-zero element in the second list from the second index and the first run value.

50. A digital processing system as in claim 43, wherein each element of the first list of elements comprises more than one bit.

51. A digital processing system to perform zero run length encoding, the system comprising:

memory storing a list of elements; and a plurality of execution units each coupled with the memory, the plurality of execution units having a first vector execution unit, the first vector execution unit computing a first run value of a last element of the list, one of the plurality of execution units computing a first index pointing to a last non-zero element in the list from a second index indicating a number of elements in the list and the first run value.

52. A digital processing system as in claim 51 wherein the plurality of execution units processes elements of the list to zero run length encode the list of elements to generate first data until the last non-zero element indicated by the first index is zero run length encoded without going through elements located after the last non-zero element in the list.

53. A digital processing system as in claim 51, wherein the last element has a value of zero.

* * * * *